(12) United States Patent
Tomita

(10) Patent No.: US 6,806,549 B2
(45) Date of Patent: Oct. 19, 2004

(54) METHOD OF MANUFACTURING SEMICONDUCTOR DEVICE INCLUDING A STEP OF FORMING ELEMENT ISOLATION TRENCH AND SEMICONDUCTOR DEVICE

(75) Inventor: Kazuo Tomita, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/119,065

(22) Filed: Apr. 10, 2002

(65) Prior Publication Data

US 2002/0197819 A1 Dec. 26, 2002

(30) Foreign Application Priority Data

Jun. 22, 2001 (JP) ........................................ 2001-190397

(51) Int. Cl.⁷ .......................... H01L 29/00; H01L 21/76
(52) U.S. Cl. ...................................... 257/510; 257/797
(58) Field of Search ................................ 257/510, 514, 257/515, 797; 438/401, 424

(56) References Cited

U.S. PATENT DOCUMENTS 4,599,136 A * 7/1986 Araps et al. ................ 156/643
6,159,822 A * 12/2000 Yang et al. .................. 438/427
6,197,481 B1 * 3/2001 Chang et al. ................ 438/314
6,239,476 B1 * 5/2001 Gardner et al. ............. 257/513
6,432,797 B1 * 8/2002 Cha et al. .................... 438/424

FOREIGN PATENT DOCUMENTS

| JP | 9-134954 | 5/1997 |
|----|----------|--------|
| JP | 2000-100928 | 4/2000 |
| KR | 2000-0071584 | 10/2000 |

* cited by examiner

*Primary Examiner*—Chandra Chaudhari
*Assistant Examiner*—David S. Blum
(74) *Attorney, Agent, or Firm*—McDermott Will & Emery LLP

(57) ABSTRACT

An element isolation trench is formed in a mark section of a substrate. Further, an element isolation dielectric film is formed in the element isolation trench. An etch stopper film formed from a silicon nitride film is formed so as to cover at least a portion of the surface of an element isolation dielectric film formed in the mark section. Circuit elements are formed in a circuit section of the substrate while the etch stopper film formed in the mark section is used as an inspection mark.

6 Claims, 27 Drawing Sheets

Fig. 1
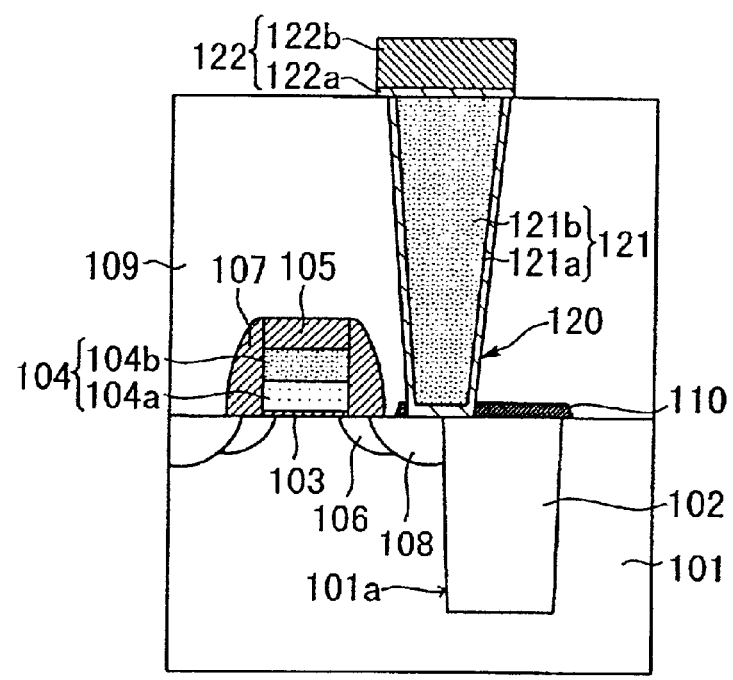
Fig. 2A
Fig. 2B
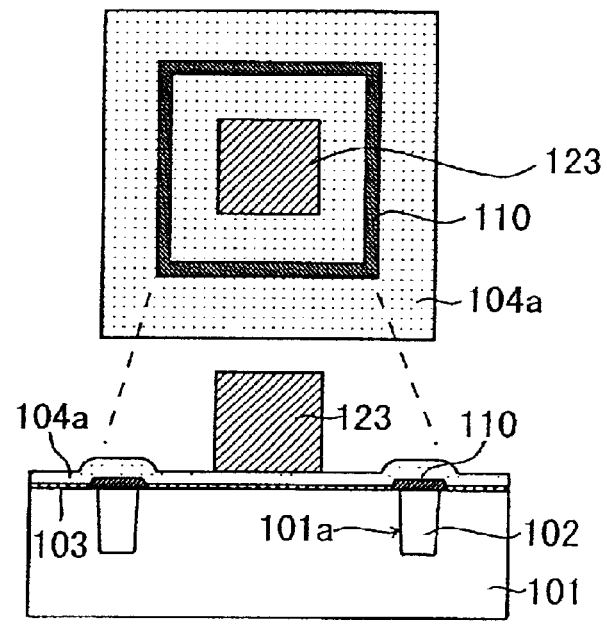

Fig. 34
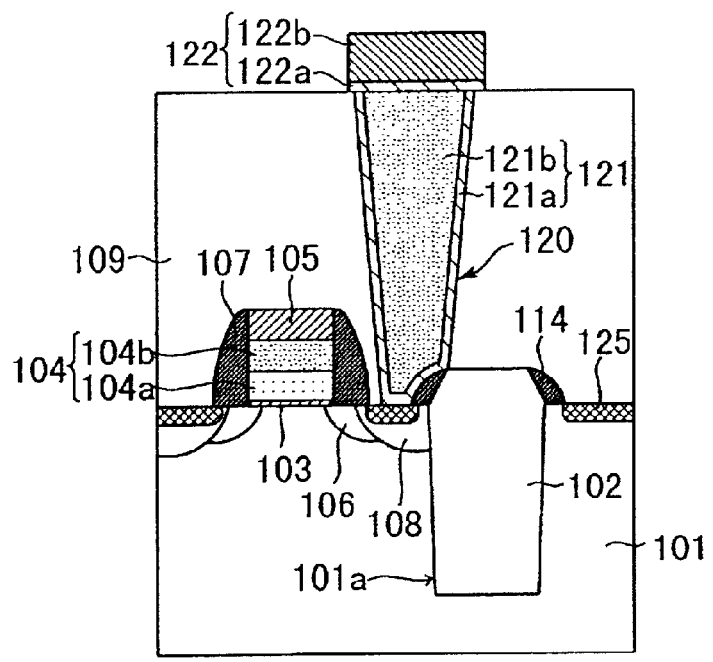
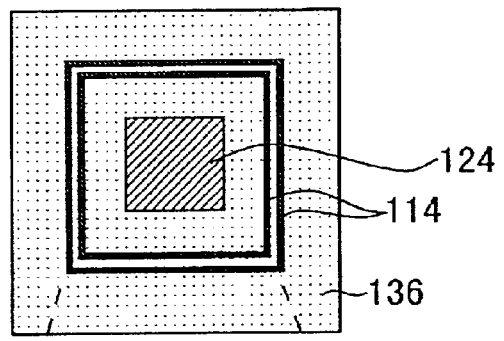
Fig. 35A
Fig. 35B
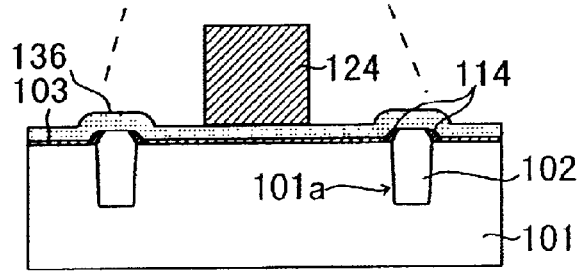

Fig. 38
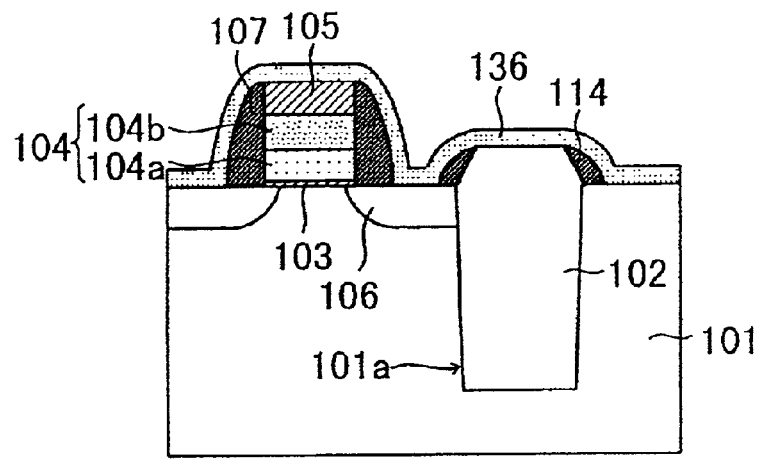
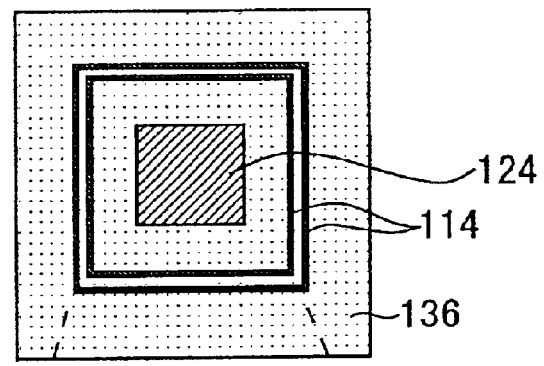
Fig. 39A
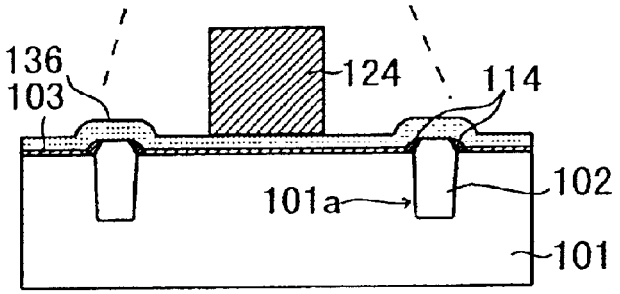
Fig. 39B

*Fig. 43*
*Background Art*
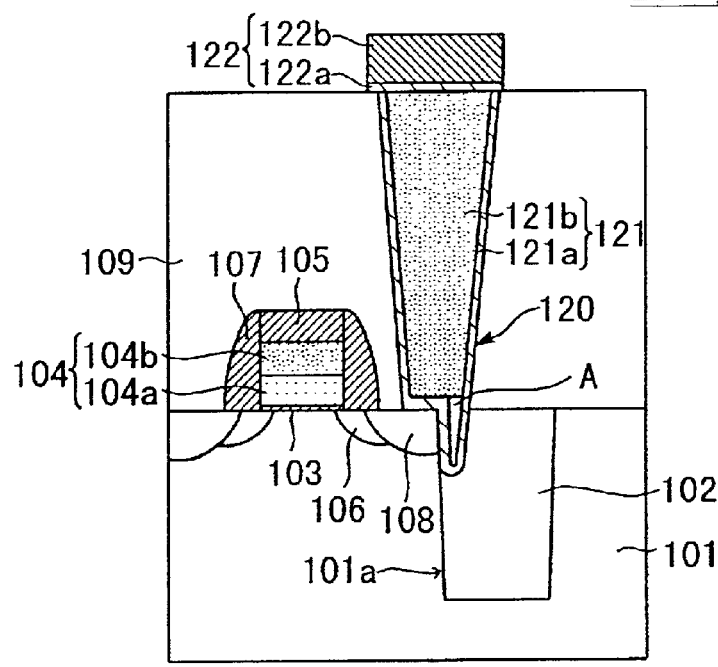
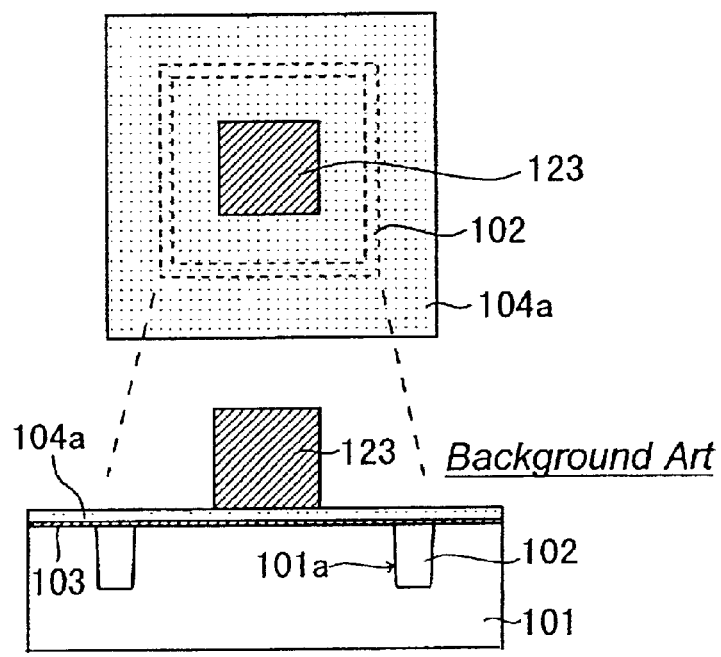
*Fig. 44A*
*Background Art*
*Fig. 44B*
*Background Art*

METHOD OF MANUFACTURING SEMICONDUCTOR DEVICE INCLUDING A STEP OF FORMING ELEMENT ISOLATION TRENCH AND SEMICONDUCTOR DEVICE

BACKGROUND OF THE INVENTION

1. Field of the Invention

The present invention relates to a method of manufacturing a semiconductor device and to a semiconductor device manufactured thereby and, more particularly, to an element isolation technique.

2. Description of the Background Art

Recent progress has been made in miniaturization, packing density, and operating speed of a semiconductor device. In connection with this achievement, decreasing the resistance of a contact hole of high aspect ratio and decreasing a leakage current developing in an element isolation dielectric film have become very important.

A conventional semiconductor device will now be described hereinbelow.

FIG. 43 is a cross-sectional view for describing a circuit section of a conventional semiconductor device. FIGS. 44A and 44B are views for describing a mark section of a conventional semiconductor device.

FIG. 43 shows a circuit section of the semiconductor device, wherein a contact hole is opened so as to partial lie off an active region.

In FIG. 43, reference numeral 101 designates a silicon substrate; 102 designates an element isolation dielectric film; 103 designates a gate dielectric film; 104 designates a first interconnection layer (gate electrode); 104a designates apolysilicon film; 104b designates a tungsten film; 105 designates a dielectric film; 106 designates a lightly-doped diffusion layer (a lightly-doped n⁻ layer); 107 designates a sidewall; 108 designates a heavily-doped diffusion layer (a heavily-doped n⁺ layer); 109 designates an interlayer dielectric film; 120 designates a contact hole; 121 designates a contact (contact plug); 121a designates a barrier metal layer; 121b designates a tungsten plug; 122 designates a second interconnection layer; 122a designates a barrier metal layer; and 122b designates a tungsten film.

FIGS. 44A and 44B show a mark section of the semiconductor device after a resist pattern 123 has been formed for introducing n-type dopants into the polysilicon film 104a. Here, the mark section refers to an area in which there is formed an alignment mark to be used for positioning (alignment) a photomask immediately before a pattern is exposed, or an area where there is formed an overlay mark for checking an overlay between an exposure pattern (resist pattern) and a base layer. In relation to FIG. 44, those elements which are the same as those shown in FIG. 43 are assigned the same reference numerals, and repeated explanations thereof are simplified or omitted. Reference numeral 123 shown in FIG. 44 designates a resist pattern.

The element isolation dielectric film 102 formed in the mark section has hitherto been used as an overlay mark for use with the resist pattern 123.

The above-described conventional semiconductor device involves the following problems.

First, as shown in FIG. 43, when the contact hole 120 is formed outside the active region, the contact hole 120 overlaps the element isolation dielectric film 102. Here, the interlayer dielectric film 109 and the element isolation dielectric film 102 are of silicon oxide film. For this reason, when the contact hole 120 is formed by means of dry etching the interlayer dielectric film 109, an etch selectivity to the element isolation dielectric film 102 cannot be ensured sufficiently. Accordingly, the element isolation dielectric film 102 is etched in the form of a slit in a boundary between the element isolation region and the active region; that is, a boundary between the element isolation dielectric film 102 and the heavily-doped diffusion layer 108 (see FIG. 43).

In this case, plasma damage resulting from dry etching remains in the boundary between the element isolation dielectric film 102 and the heavily-doped diffusion layer 108, thereby resulting in an increase in leakage current. When the element isolation dielectric film 102 has been etched in the form of a slit so as to become deeper than the heavily-doped diffusion layer 108, a leakage current is increased to a much greater extent.

Even when the barrier metal layer 121a is formed within the contact hole 120 by means of sputtering, the barrier metal layer 121a cannot be formed uniformly, and the tungsten plug 121b cannot be formed on the barrier metal layer 121a with superior coverage. As a result, a seam A is formed in a boundary between the element isolation dielectric film 102 and the heavily-doped diffusion layer 108. In this case, there arises an increase in the resistance of the contact, whereby the reliability of the plug deteriorates.

Second, the position of an overlay mark (i.e., the element isolation dielectric film 102) cannot be measured with a high degree of accuracy, because the element isolation dielectric film 102 used as the overlay mark is a translucent silicon oxide film and fails to ensure sufficient contrast. Thus, the position of an overlay mark is measured erroneously. Accordingly, an overlay inspection cannot be effected accurately.

As mentioned above, when the position of the element isolation dielectric film 102 has been measured erroneously, circuit elements cannot be formed accurately. For instance, the semiconductor device shown in FIGS. 44A and 44B encounters a problem of failure to attain accurate implantation of n-type dopants into the polysilicon film 104a. The same also applies to a case where p-type dopants are introduced into the polysilicon film 104a. There may arise a problem of both n-type dopants and p-type dopants being introduced into a predetermined area of the polysilicon film 104a, or a problem of no dopants being introduced into the predetermined area. This leads to the increase of the resistance of the gate electrode 104, thereby inducing device failures.

SUMMARY OF THE INVENTION

The present invention has been conceived to solve the previously-mentioned problems and a general object of the present invention is to provide a novel and useful plasma etching apparatus and to provide a novel and useful plasma etching method.

A more specific object of the present invention is to provide a highly reliable contact and is to measure an inspection mark accurately.

The above object of the present invention is attained by a following method of manufacturing a semiconductor device and a following semiconductor device.

According to a first aspect of the present invention, the method of manufacturing a semiconductor device having a substrate on which are provided a mark section and a circuit section, the circuit section including an element isolation region for isolating an active region, the method comprises the steps of: forming an element isolation trench in the element isolation region and the mark section; forming an element isolation dielectric film in the element isolation trench; forming an etch stopper film so as to cover at least a portion of an edge of the element isolation dielectric film; and forming circuit elements in the circuit section while the etch stopper film formed in the mark section is used as an inspection mark.

According to a second aspect of the present invention, the method of manufacturing a semiconductor device having a substrate on which are provided a mark section and a circuit section, the circuit section including an element isolation region for isolating an active region, the method comprises the steps of: forming an element isolation trench in the element isolation region and the mark section; forming an element isolation dielectric film in the element isolation trench; forming a gate electrode in the active region; forming an impurity diffusion layer in the substrate adjacent to the gate electrode; forming a dielectric film on the entire surface of the substrate after formation of the impurity diffusion layer; forming an etch stopper film which covers an edge of the element isolation dielectric film, by means of etching back the dielectric film; and forming circuit elements in the circuit section while the etch stopper film formed in the mark section is taken as an inspection mark.

According to a third aspect of the present invention, the semiconductor device having a substrate on which are provided a mark section and a circuit section, the circuit section including an element isolation region for isolating an active region, the device comprises: an element isolation trench formed in the mark section; an element isolation dielectric film formed in the element isolation trench; an etch stopper film covering at least a portion of an edge of the element isolation dielectric film; an interlayer dielectric film formed over an entire surface of the substrate; and a contact hole extending from the surface of the interlayer dielectric film to the surface of the substrate.

Other objects and further features of the present invention will be apparent from the following detailed description when read in conjunction with the accompanying drawings.

BRIEF DESCRIPTION OF THE DRAWINGS

FIG. 1 is across-sectional view for describing a circuit section of a semiconductor device according to a first embodiment of the present invention;

FIGS. 2A and 2B are views for describing a mark section of a semiconductor device according to a first embodiment of the present invention;

FIG. 34 is a cross-sectional view for describing a circuit section of a semiconductor device according to a fifth embodiment of the present invention;

FIGS. 35A and 35B are views for describing a mark section of a semiconductor device according to a fifth embodiment of the present invention;

FIGS. 36 through 41 are views for describing a method of manufacturing a semiconductor device according to a fifth embodiment of the present invention;

FIG. 43 is a cross-sectional view for describing a circuit section of a conventional semiconductor device; and FIGS. 44A and 44B are views for describing a mark section of a conventional semiconductor device.

DETAILED DESCRIPTION OF THE PREFERRED EMBODIMENTS

Figure 3:
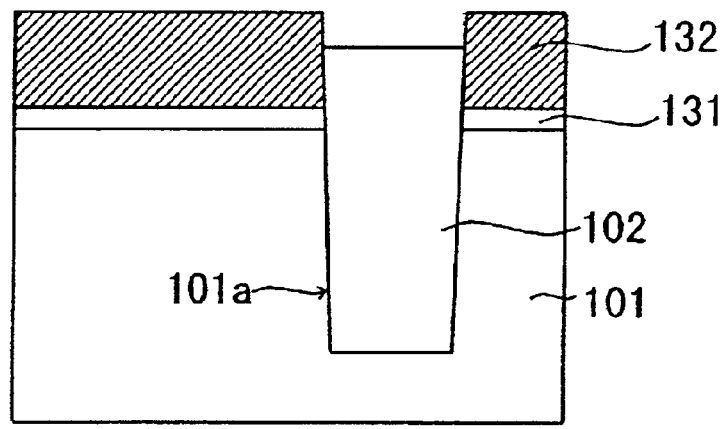
FIGS. 3 through 8 are views for describing a method of manufacturing a semiconductor device according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

FIG. 1 is across-sectional view for describing a circuit section of a semiconductor device according to a first embodiment of the present invention. FIGS. 2A and 2B are views for describing a mark section of a semiconductor device according to a first embodiment of the present invention.

In FIG. 1, reference numeral 101 designates a substrate; for example, a p-type silicon wafer (semiconductor substrate) having a specific resistance of 10 $\Omega$·cm. The substrate 101 comprises a circuit section including an active region and an element isolation region for isolating the active region, and a mark section on which an inspection mark to be described later is formed. Reference numeral 101a designates an element isolation trench formed in the substrate 101. Reference numeral 102 designates an element isolation dielectric film formed in the element isolation trench 101a; for example, a plasma silicon oxide film having a thickness of, e.g., 300 nm. A silicon oxide film (hereinafter called an "HDP oxide film") formed by means of, e.g., the high-density chemical vapor deposition (HDPCVD) method is taken as the plasma silicon oxide film. Reference numeral 103 designates a gate dielectric film; for example, a silicon oxynitride (SiON) or silicon oxide film having a thickness of 3 nm.

Reference numeral 104 designates a gate electrode serving as a first interconnection layer. The first interconnection layer is formed by means of stacking, e.g., a polysilicon film 104a and a tungsten film 104b. Here, the polysilicon film 104a is formed by means of introducing, e.g., phosphor ($P^+$), as an n-type dopant in an n-type region of a non-doped polysilicon film at 10 keV and 5E15 $cm^{-2}$. For example, boron ($BF2^+$) is introduced as a p-type dopant into a p-type region of the non-doped polysilicon film at 3 keV and 5E15 $cm^{-2}$.

Reference numeral 105 designates a dielectric film for use as a hard mask; for example, a silicon nitride film having a thickness of 100 nm. Reference numeral 106 designates a lightly-doped diffusion layer (i.e., an $n^-$-lightly-doped layer) of an extension. For example, the lightly-doped layer is formed by means of introducing arsenic into the substrate 101 at 30 keV, 1E14 $cm^{-2}$, and an angle of 45°. Reference numeral 107 designates a sidewall; for example, a silicon nitride film having a thickness of 50 nm. Reference numeral 108 designates a heavily-doped diffusion layer (an $n^+$-heavily-doped layer). For example, arsenic is introduced into the substrate 101 at 50 keV, 5E15 $cm^{-2}$, and an angle of 7°. Reference numeral 109 designates an interlayer dielectric film; e.g., an HDP oxide film having a thickness of 700 nm.

Reference numeral 110 designates an etch stopper film formed so as to cover at least a portion of the surface of the element isolation dielectric film 102; for example, a silicon nitride film having a thickness of about 30 nm. The etch stopper film 110 is formed excessively over the heavily-doped diffusion layer 108 as well as on the element isolation dielectric film 102 so as to cover a boundary between the heavily-doped diffusion layer 108 in the active region and the element isolation-dielectric film 102.

Reference numeral 120 designates a contact hole having a bottom diameter of, for example, 0.1 μm. Reference numeral 121 designates a contact (contact plug) formed in the contact hole 120. The contact 121 has the barrier metal layer 121a formed from TiN (20 nm in thickness)/Ti (20 nm in thickness), and the tungsten plug 121b. Reference numeral 122 designates a second interconnection layer. The second interconnection layer 122 is formed by means of stacking the barrier metal layer 122a consisting of TiN/Ti (20/20 nm) and the tungsten film 122b of 100 nm.

As shown in FIGS. 2A and 2B, those elements assigned the same reference numerals as those shown in FIG. 1 designate the same elements. Reference numeral 123 designates a resist pattern. FIGS. 2A and 2B show a mark section of a semiconductor device after formation of a resist pattern 123 serving as a mask for introducing n-type dopants into the polysilicon film 104a. Here, the mark section refers to an area in which there is formed an alignment mark to be used for positioning (alignment) a photomask immediately before exposure of a pattern, or an area where there is formed an overlay mark for checking an overlay between an exposure pattern (resist pattern) and a base layer. An etch stopper film 110 formed in the mark section is used as the overlay mark for checking an overlay between the resist pattern 123 and the base layer. The etch stopper film 110 serving as an outer mark is formed in the mark section to a width of, e.g., 0.2 to 0.4 μm so as to assume the shape of a square whose side measures, e.g., 20 to 30 μm. The resist pattern 123 serving as an inner mark is formed so as to assume the shape of a square whose side measures, e.g., 10 to 15 μm.

A method of manufacturing a semiconductor device according to a first embodiment will now be described.

FIGS. 3 through 8 are views for describing a method of manufacturing a semiconductor device according to a first embodiment.

As shown in FIG. 3, a thermal oxide film 131 is first formed on a substrate 101 to a thickness of, e.g., 30 nm. Next, a silicon nitride film 132 is formed on the thermal oxide film 131 to a thickness of, e.g., 150 nm. Further, a resist pattern (not shown) is formed on the silicon nitride film 132 for covering the active region. While the thus-formed resist pattern is taken as a mask, the silicon nitride film 132 and the thermal oxide film 131 are dry-etched. While the thus-etched silicon nitride film 132 and thermal oxide film 131 are taken as masks, the substrate 101 is dry-etched. As a result, an element isolation trench 101a is formed in the substrate 101 to a depth of, e.g., 300 nm.

An HDP oxide film, for example, is deposited in the element isolation trench 101 as the element isolation dielectric film 102 to a thickness of 500 nm, and the wafer is subjected to CMP processing.

In order to reduce the height of a trench isolation step, the element isolation dielectric film 102 is subjected to wet etching by only a thickness of 150 nm.

Figure 4:
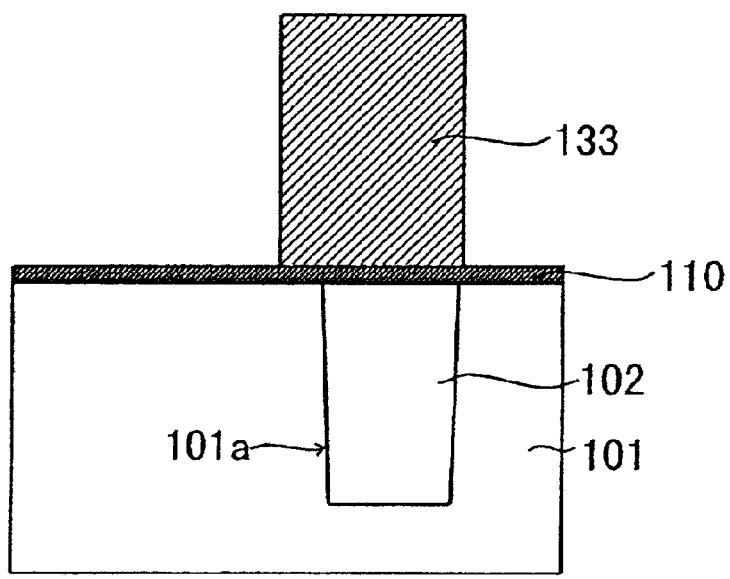

As shown in FIG. 4, the silicon nitride film 132 and the silicon oxide film 131 are subjected to wet etching, so that the surface of the substrate 101 becomes equal in level to the surface of the element isolation dielectric film 102. Next, a silicon nitride film serving as the etch stopper film 110 is formed over the entire surface of the substrate to a thickness of 30 nm. A resist pattern 133 is formed on the etch stopper film 110. Here, the resist pattern 133 is formed so as to cover at least an edge of the element isolation dielectric film 102.

Figure 5:
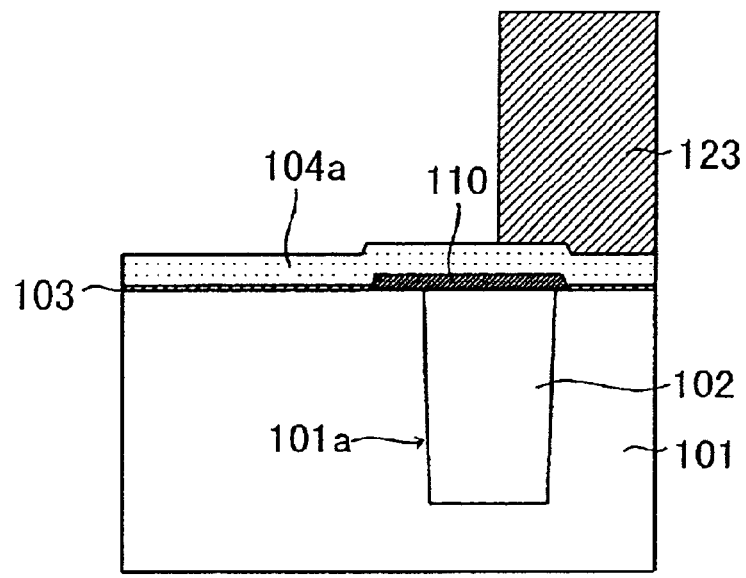

As shown in FIG. 5, while the resist pattern 133 is taken as a mask, the etch stopper film 110 is subjected to wet etching. Simultaneously, the etch stopper film 110 of the mark section is also patterned (see FIGS. 6A and 6B).

Next, the resist pattern 133 is removed. For instance, a silicon oxynitride film (SiON) is formed as the gate dielectric film 103 to a thickness of 3 nm. A non-doped polysilicon film 104a is formed on the gate dielectric film 103 to a thickness of 100 nm.

A resist film is formed on the polysilicon film 104a, and a pattern is projected onto the resist film through exposure. As a result, a resist pattern 123 is formed on the polysilicon film 104a for introducing n-type dopants into the polysilicon film 104a.

Figure 6A:
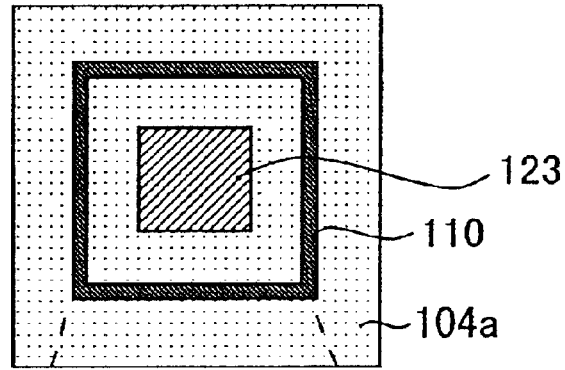
Figure 6B:
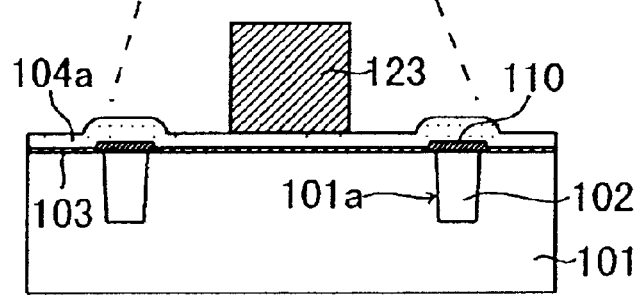

As shown in FIGS. 6A and 6B, the resist pattern 123 is also formed in the mark section concurrently.

After the resist pattern 123 has been formed, an overlay check is made in connection with an overlap between the resist pattern 123 of the circuit section and the base layer, while the etch stopper film 110 located in the mark section is taken as an overlay mark. Through overlay inspection, the position of the inspection mark (i.e., the etch stopper film 110) can be measured accurately. Accordingly, overlay inspection of the resist pattern 123 can be performed accurately.

The resist pattern 123 of the mark section is patterned to a dimension close to the minimum rule of the resist pattern 123 formed in the circuit section. As a result, the influence of aberration of a lens provided in a stepper (not shown) can be suppressed, thereby improving the accuracy of an overlay inspection.

Although not illustrated, an n-type dopant; e.g., phosphor ($P^+$), is introduced into the polysilicon film 104a in an n-type region at 10 keV and 5E15 $cm^{-2}$ while the resist pattern 123 is taken as a mask.

Similarly, a p-type dopant; e.g., boron ($BF_2^+$), is introduced into the p-type polysilicon film 104a at 3 keV and 5E15 $cm^{-2}$.

Figure 7:
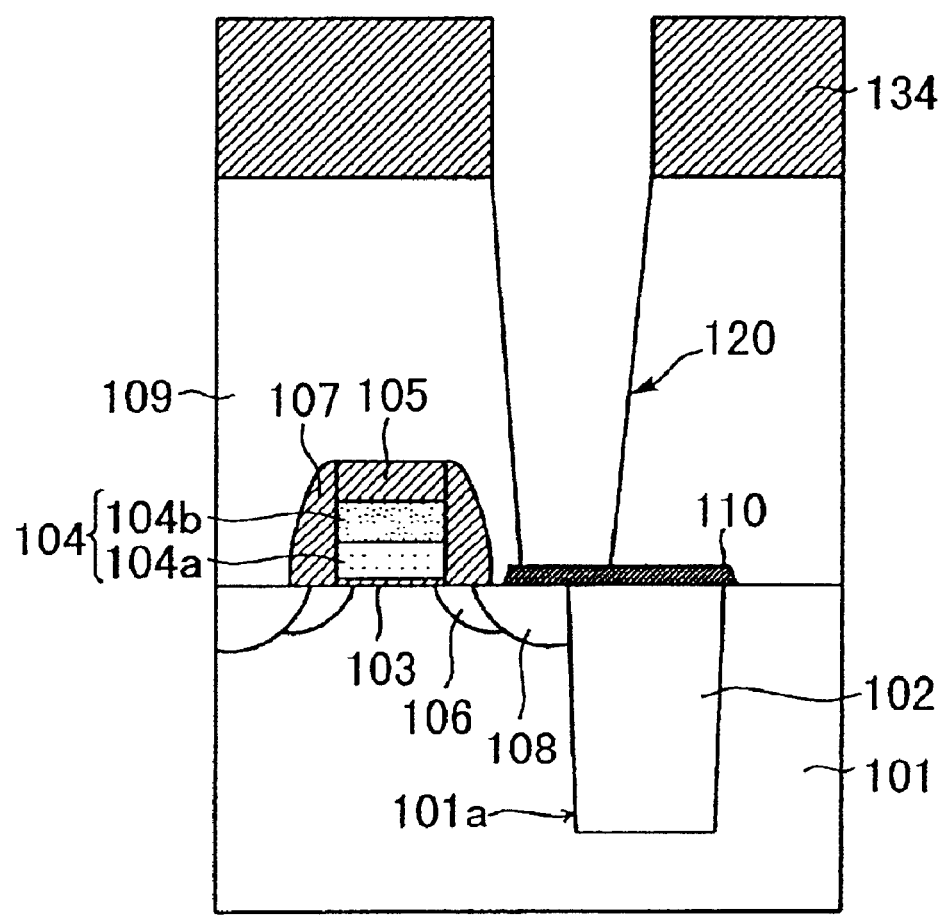

As shown in FIG. 7, a tungsten film 104b is formed on the polysilicon film 104a to a thickness of 100 nm. A dielectric film 105 is formed on the tungsten film 104b to a thickness of 100 nm. Next, the dielectric film 105 is patterned, and the tungsten film 104b and the polysilicon film 104a are subjected to dry etching while the thus-patterned dielectric film 105 is taken as a mask, thereby forming the gate electrode 104.

Subsequently, the lightly-doped diffusion layer (n⁻-lightly-doped layer) 106 is formed by means of introducing, e.g., arsenic (As⁺) into the substrate 101 at an angle of 45° and at 30 keV and $1E14\ cm^{-2}$. For example, a silicon nitride film is formed over the substrate to a thickness of 50 nm, and the silicon nitride film is etched back. Thus, a sidewall 107 is formed on the side surface of the gate electrode 104. The heavily-doped (highly-doped n⁺ layer) 108 which is higher in doping level than the lightly-doped diffusion layer 106 is formed, by means of introducing, e.g., arsenic, into the substrate 101 at 50 keV and $5E15\ cm^{-2}$ while the sidewall 107 is taken as a mask.

Next, an HDP oxide film, for example, is formed to a thickness of 1000 nm as the interlayer dielectric film 109, and the interlayer dielectric film 109 is subjected to CMP by an amount of 300 nm. The resist pattern 134 is formed on the interlayer dielectric film 109.

Subsequently, the interlayer dielectric film 109 is subjected to dry etching on etching (main etching) condition that there is achieved a high etch selectivity to the etch stopper film 110, while the resist pattern 134 is taken as a mask. As a result, there is formed, in the interlayer dielectric film 109, a contact hole 120 which has a diameter of 0.2 μm at the surface of the interlayer dielectric film 109 and which extends from the surface of the interlayer dielectric film 109 to the surface of the etch stopper film 110. Since the interlayer dielectric film 109 is subjected to dry etching on condition that the there is achieved a high etch selectivity to the etch stopper film 110; that is, on condition that there is achieved a high etch selectivity to a silicon nitride film, etching damage is not imparted to the active region of the substrate 101 even when a plurality of contact holes of different depths are formed simultaneously.

The etch stopper film 110 is etched on etching (overetching) condition that there is achieved a high etch selectivity to the element isolation dielectric film 102 and the substrate 101, thereby forming a contact hole 120 extending from the surface of the interlayer dielectric film 109 to the surface of the substrate 101. The etch stopper film 110 having a comparatively small and uniform thickness can be removed within a short period of time. Hence, etching damage to the substrate 101 can be diminished. More specifically, the contact hole 120 is formed in two steps, and hence etching damage to both the substrate 101 and the element isolation dielectric film 102 can be diminished. Further, the etch stopper film 110 is formed in a boundary between the heavily-doped diffusion layer 108 and the element isolation dielectric film 102, thereby preventing etching of the edge of the element isolation dielectric film 102.

Figure 8:
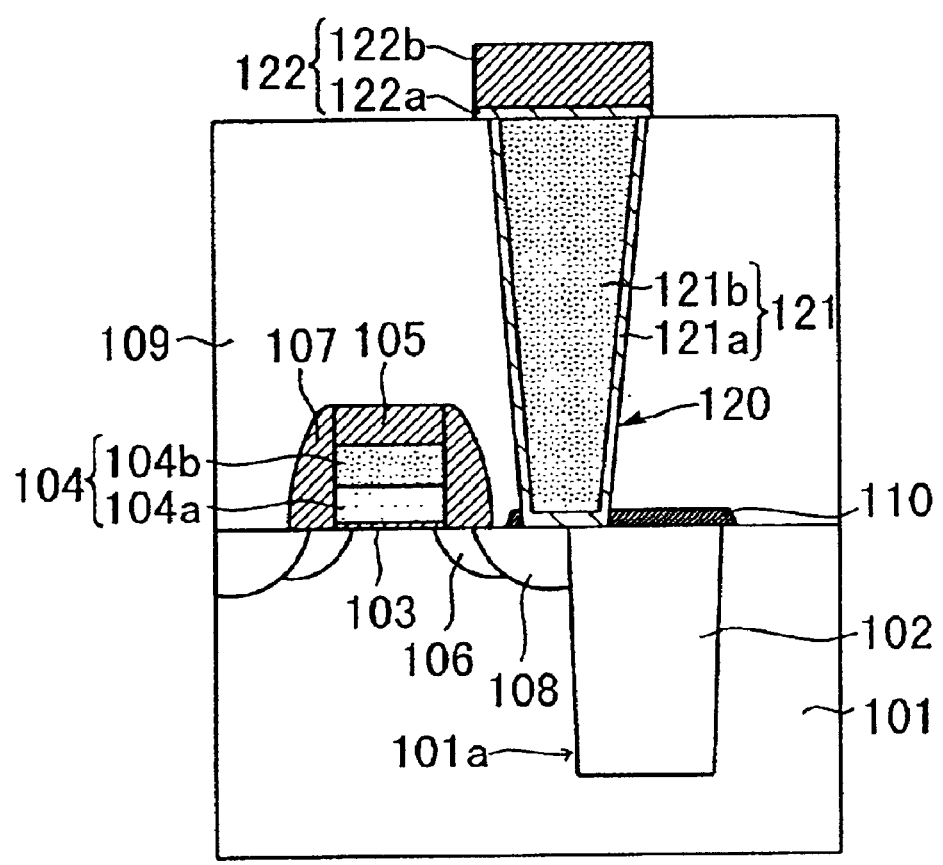

Finally, as shown in FIG. 8, the barrier metal layer 121a consisting of, e.g., TiN/Ti, is formed in the contact hole 120 to a thickness of 20 nm/20 nm. Further, tungsten 121b is formed in the contact hole 120 to a thickness of 200 nm by means of chemical vapor deposition (CVD). Unnecessary tungsten is removed from the thus-formed tungsten layer, by means of the chemical and mechanical polishing (CMP) technique. As a result, a tungsten plug 121b is formed. More specifically, a contact 121 consisting of the barrier metal layer 121a and the tungsten plug 121b is formed in the contact hole 120. For example, TiN/Ti is formed on the contact 121 as the barrier metal layer 122a to a thickness of 20 nm/20 nm, thereby forming the tungsten film 122b to a thickness of 100 nm. Thus, the barrier metal layer 122a and the tungsten film 122b are patterned. As a result, a second interconnection layer 122 is formed on the contact 121.

As mentioned above, in the first embodiment, a silicon nitride film serving as an etch stopper film 110 is formed at a boundary between the active region and the element isolation region; that is, a boundary between the heavily-doped diffusion layer 108 and the element isolation dielectric film 102. As a result, there can be reduced etching damage imparted to the substrate 101 when the contact hole 120 is formed (particularly, over-etching operation). Hence, there can be formed a superior contact junction involving a small leakage current.

When the contact hole 120 is formed, the portion of the element isolation dielectric film 102 located at the boundary; that is, the edge of the element isolation dielectric film 102, is not etched in the form of a slit. Thus, the bottom of the contact hole 120 assumes an improved geometry. Hence, the barrier metal layer 121a and the tungsten layer 121b can be formed in the contact hole 120 with superior coverage. Hence, the contact 121 can be formed so as to have a high degree of reliability.

In the first embodiment, the etch stopper film 110 is formed simultaneously in the mark section as well as in the circuit section. The etch stopper film 110 formed in the mark section is used as an overlay mark. Since the etch stopper film 110 has superior contrast, the position of the etch stopper film 110; that is, the position of an inspection mark, can be measured readily and with high accuracy. Accordingly, an overlay between the resist pattern (e.g., the resist pattern 123 shown in FIG. 5) and the base layer can be inspected accurately.

The first embodiment has described a case where the etch stopper film 110 located in the mark section is utilized as an overlay mark. However, the etch stopper film 110 can also be utilized as an alignment mark. More specifically, an inspection of the positioning of a photomask (i.e., a rough positioning inspection and a fine positioning inspection) can be conducted while the etch stopper film 110 is taken as an alignment mark. Even in this case, the position of an alignment mark can be measured with high accuracy, as in the case of an overlay mark.

Accordingly, the positioning of a photomask can be inspected accurately. Therefore, a resist pattern can be formed accurately (the same also applies to the second through fifth embodiments to be described later). For example, the resist pattern 123 can be formed accurately, and there can be prevented occurrence of an overlap between an n-type region and a p-type region in the polysilicon film 104a and occurrence of displacement of an implanting position.

The first embodiment has described an overlap inspection of the resist pattern 123 for introducing n-type dopants. The present invention can also be applied for an overlay inspection about a resist pattern formed by means of patterning of a gate electrode, a patterning operation for forming a dual-gate oxide film, or a patterning operation for forming the capacitance element(s) of an analog circuit section.

The first embodiment has described a case where the etch stopper film 110 is formed to the heavily-doped diffusion layer 108 in the active region. However, the only requirement is that the etch stopper film 110 be formed in at least the bottom of the contact hole 120. More specifically, the area where the etch stopper film 110 is to be formed is changed appropriately in accordance with the diameter of the contact hole 120.

In the first embodiment, the etch stopper film 110 is formed in the form of a single layer of silicon nitride film. However, the etch stopper film 110 may be formed in the form of a multi-layer film including a silicon nitride film. For instance, the etch stopper film 110 may be formed from a multilayer dielectric film, by means of forming a silicon oxide film (non-doped silicon oxide film) and stacking a silicon nitride film on the silicon oxide film. In this case, stress acting on the edge of the element isolation dielectric film 102 can be mitigated (the same also applies to second through fifth embodiments to be described later).

The dielectric film 105 serving as a hard mask is not limited to a silicon nitride film and may be embodied as a silicon oxide film or a multilayer film consisting of a silicon oxide film and a silicon nitride film. Further, an ordinary resist pattern may also be employed in lieu of the dielectric film 105 (the same also applies to the second through fifth embodiments to be described later).

The resistance of a surface of the heavily-doped diffusion layer 108 may be reduced through silicidation (e.g., formation of cobalt silicide or titanium silicide). Even in this case, the etch stopper film 110 may be used as an inspection mark (the same also applies to the second and fourth embodiments to be described later).

Second Embodiment

In the first embodiment, an element isolation dielectric film is formed such that the surface of the active region becomes flush with the surface of the element isolation dielectric film. An etch stopper film is formed so as to cover the edge of the surface of the element isolation dielectric film.

In a second embodiment, the surface of the element isolation dielectric film located in the circuit section and the mark section are made lower than the surface of the substrate located in the active region. An etch stopper film is formed along the edge of each of the surfaces of the element isolation dielectric films.

Figure 9:
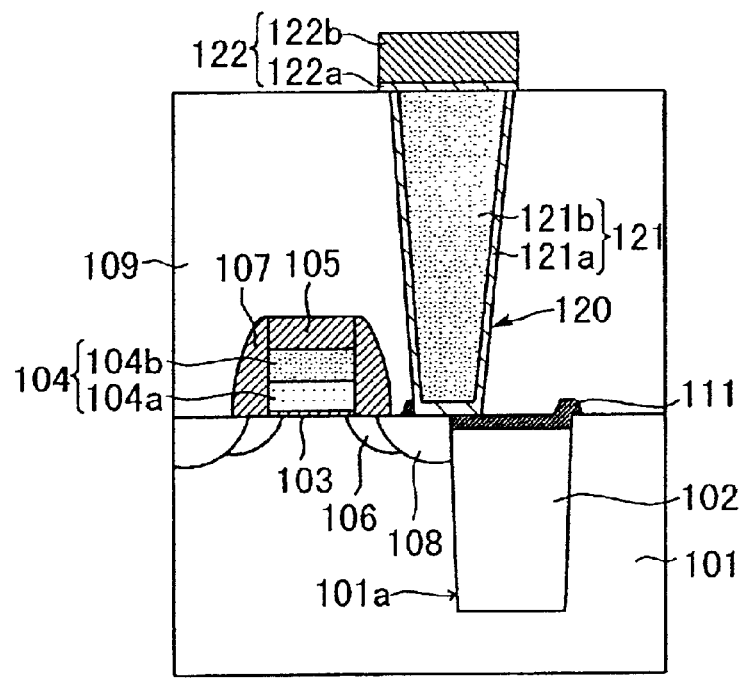
FIG. 9 is across-sectional view for describing a circuit section of a semiconductor device according to a second embodiment of the present invention.
Figure 10A:
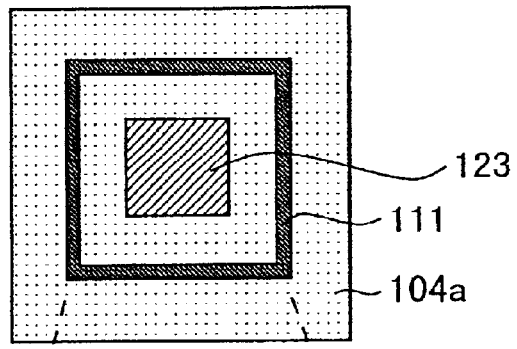
FIGS. 10A and 10B are views for describing a mark section of a semiconductor device according to a second embodiment of the present invention.
Figure 10B:
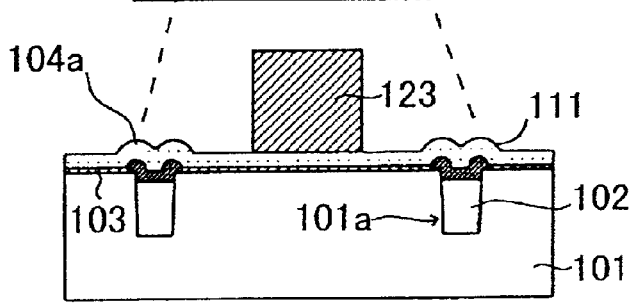

FIG. 9 is across-sectional view for describing a circuit section of a semiconductor device according to a second embodiment of the present invention. FIGS. 10A and 10B are views for describing a mark section of the semiconductor device according to the second embodiment.

In FIGS. 9, 10A, and 10B, those reference numerals which are the same as those shown in FIG. 1, 2A and 2B designate the same elements, and hence their explanations are simplified or omitted.

As shown in FIG. 9, the element isolation dielectric film 102 is embedded in the element isolation trench 101a to a thickness of 250 nm, whereby the surface of the element isolation dielectric film 102 becomes lower than the surface of the substrate 101. A silicon nitride film serving as an etch stopper film 111 is formed so as to cover at least an edge of the element isolation dielectric film 102. An area located above the element isolation dielectric film 102; namely, the both sides of the element isolation trench 101a where no element isolation dielectric film 102 is embedded, is covered with the etch stopper film 111. As shown in FIGS. 10A and 10B, the etch stopper film 111 is formed so as to cover an edge of the element isolation dielectric film 102 in the mark section, as in the case of the circuit section. The etch stopper film 111 formed in the mark section is used as an overlay mark for inspecting an overlay between the resist pattern 123 of the circuit section and the base layer (which will be described later).

A method of manufacturing a semiconductor device according to the second embodiment will now be described. FIGS. 11 through 16 are views for describing a method of manufacturing the semiconductor device according to the second embodiment.

Figure 11:
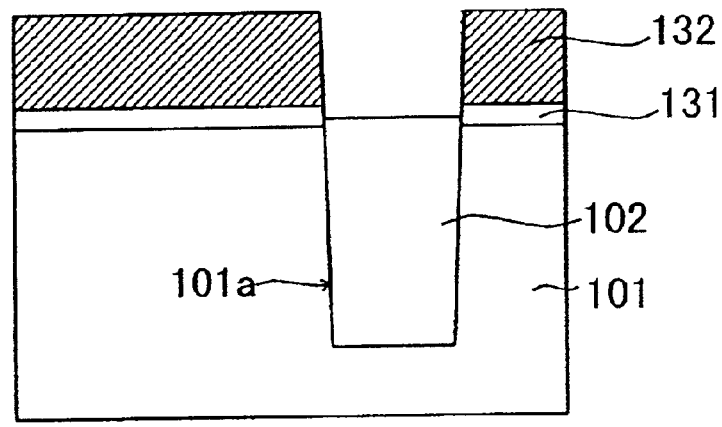
FIGS. 11 through 16 are views for describing a method of manufacturing a semiconductor device according to a second embodiment of the present invention.

As shown in FIG. 11, a thermal oxide film 131 is formed on the substrate 101 to a thickness of, e.g., 30 nm. Next, a silicon nitride film 132 is formed on the thermal oxide film 131 to a thickness of, e.g., 150 nm. The resist pattern (not shown) covering an active region is formed on the silicon nitride film 132. While the thus-formed resist pattern is taken as a mask, the silicon nitride film 132 and the thermal oxide film 131 are subjected to dry etching. Further, the substrate 101 is subjected to dry etching while the thus-etched silicon nitride film 132 and the thermal oxide film 131 are taken as masks. As a result, the element isolation trench 101a is formed in the substrate 101 to a depth of, e.g., 300 nm.

Next, an HDP oxide film is deposited to a thickness of 500 nm in the element isolation trench 101a as an element isolation dielectric film 102. The thus-deposited HDP oxide film is then subjected to CMP processing.

The element isolation dielectric film 102 is subjected to wet etching by only an amount of, e.g., 200 nm.

Figure 12:
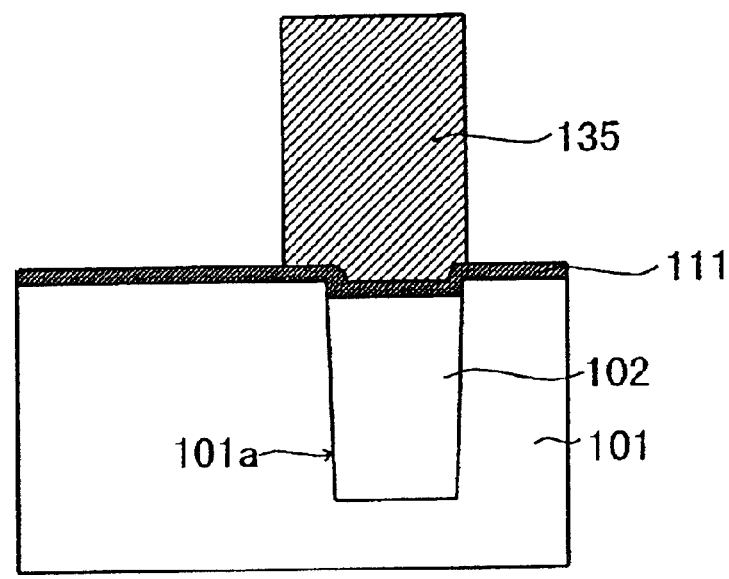

As shown in FIG. 12, the silicon nitride film 132 and the silicon oxide film 131 are subjected to wet etching. As a result, the upper portion of the element isolation dielectric film 102 is removed such that the surface of the element isolation dielectric film 102 becomes lower than that of the substrate 101. Next, a silicon nitride film serving as the etch stopper 111 is formed over the substrate 101 to a thickness of 30 nm. Further, the resist pattern 135 is formed on the etch stopper 111. The resist pattern 135 is formed so as to cover an edge of the element isolation dielectric film 102.

Figure 13:
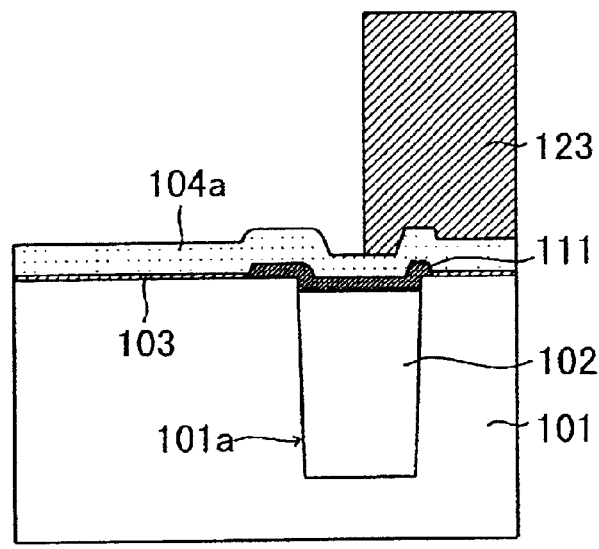

As shown in FIG. 13, the etch stopper 111 is subjected to wet etching while the resist pattern 135 is taken as a mask. Simultaneously, the etch stopper 111 located in the mark section is also patterned [see FIGS. 14A and 14B].

The resist pattern 135 is then removed. For example, a silicon oxynitride film (SiON) is formed as the gate dielectric film 103 to a thickness of 3 nm. Further, a non-doped polysilicon film 104a is formed on the gate dielectric film 103 to a thickness of 100 nm.

A resist pattern 123—which is to serve as a mask for introducing n-type dopants into the polysilicon film 104a— is formed on the non-doped polysilicon film 104a.

Figure 14A:
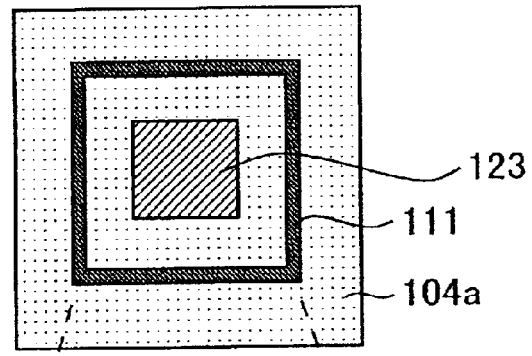
Figure 14B:
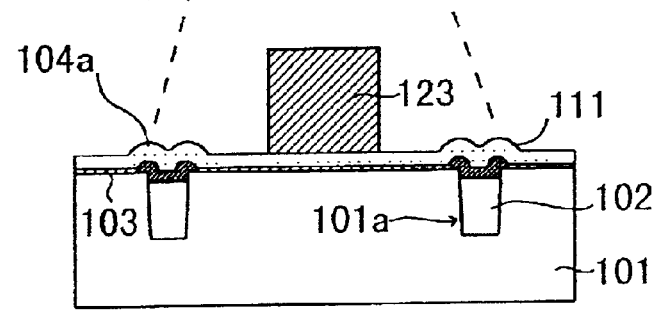

As shown in FIGS. 14A and 14B, the resist pattern 123 is formed simultaneously in the mark section.

After formation of the resist pattern 123, there is inspected an overlay between the resist pattern 123 located in the circuit section and the base layer, while the etch stopper film 111 located in the mark section is taken as an overlay mark. Through overlay inspection, the position of the overlay mark (i.e., the etch stopper film 111) can be measured accurately. Accordingly, the overlay inspection of the resist pattern 123 can be performed accurately.

The resist pattern 123 located in the mark section is patterned to a dimension close to the minimum rule of the resist pattern 123 formed in the circuit section. As a result, the influence of aberration of a lens provided in a stepper can be suppressed, thereby improving the accuracy of an overlay inspection.

N-type and p-type dopants are introduced into the polysilicon film 104a in the same manner as in the case of the first embodiment.

Figure 15:
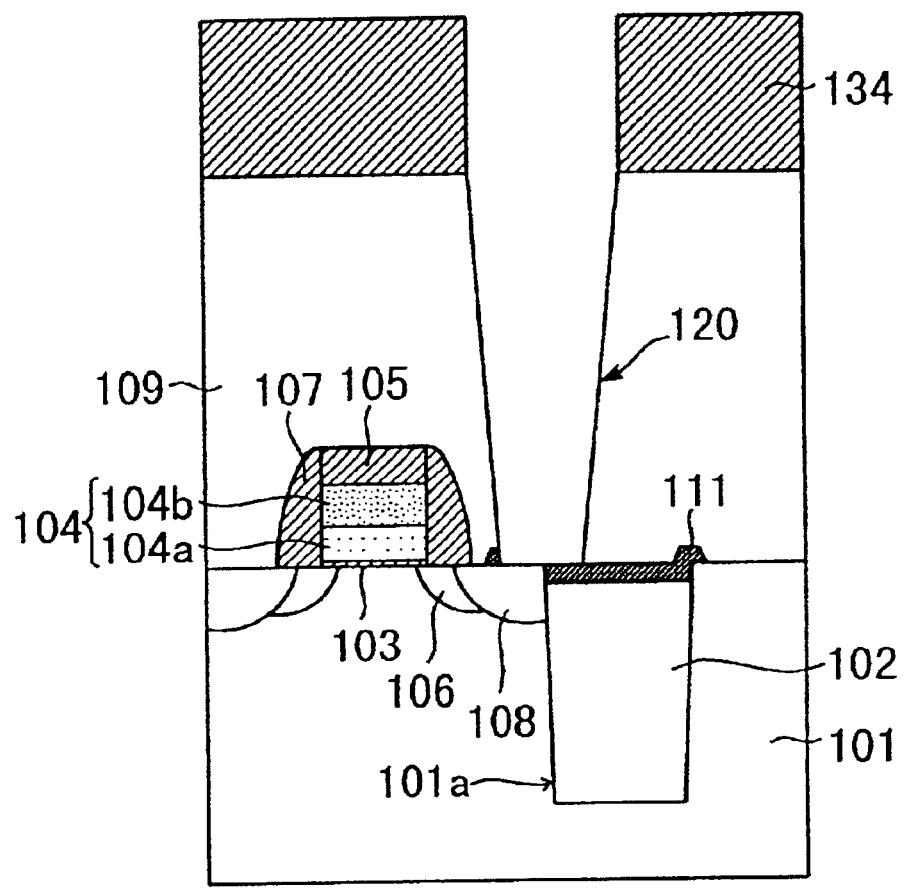

As shown in FIG. 15, the tungsten film 104b is formed on the polysilicon film 104a to a thickness of 100 nm. Further, the dielectric film 105 is formed on the tungsten film 104b to a thickness of 100 nm.

The dielectric film 105 is patterned, and the tungsten film 104b and the polysilicon film 104a are subjected to dry etching while the thus-patterned dielectric film 105 is taken as a mask. Thus, the gate electrode 104 is formed.

Subsequently, the lightly-doped diffusion layer (lightly-doped n⁻ layer) 106 is formed by means of introducing, e.g., arsenic (As⁺) to the substrate 101 at an angle of 45° and at 30 keV and 1E14 cm⁻². For instance, a silicon nitride film is formed over the entire surface of the substrate to a thickness of 50 nm, and the thus-formed silicon nitride film is etched back. As a result, the sidewall 107 is formed on either side of the gate electrode 104. For example, arsenic is introduced into the substrate 101 at 50 keV and 5E15 cm⁻² while the sidewall 107 is taken as a mask, thereby forming the heavily-doped diffusion layer (heavily-doped n⁺ layer) 108 which is higher in doping level than the lightly-doped diffusion layer 106.

For example, an HDP oxide film is formed to a thickness of 1000 nm as the interlayer dielectric film 109, and the thus-formed interlayer dielectric film 109 is subjected to CMP processing by an amount of 300 nm. The resist pattern 134 is formed on the interlayer dielectric film 109.

Subsequently, the interlayer dielectric film 109 is subjected to dry etching on etching (main etching) condition that there is achieved a high etch selectivity to the etch stopper film 111, while the resist pattern 134 is taken as a mask. As a result, there is formed, in the interlayer dielectric film 109, a contact hole 120 which has a diameter of 0.2 μm at the surface of the interlayer dielectric film 109 and which extends from the surface of the interlayer dielectric film 109 to the surface of the etch stopper film 111. Since the interlayer dielectric film 109 is subjected to dry etching on condition that the there is achieved a high etch selectivity to the etch stopper film 111; that is, on condition that there is achieved a high etch selectivity to a silicon nitride film, etching damage is not imparted to the active region of the substrate 101 even when a plurality of contact holes of different depths are formed simultaneously.

The etch stopper 111 provided on a substrate 101 is etched on etching (over-etching) condition that there is achieved a high etch selectivity to the element isolation dielectric film 102 and the substrate 101 (or the heavily-doped diffusion layer 108), thereby forming the contact hole 120 extending from the surface of the interlayer dielectric film 109 to the surface of the substrate 101. Here, the etch stopper 111 having a comparatively small and uniform thickness can be removed within a short period of time. More specifically, the contact hole 120 is formed in two steps, and hence etching damage to both the substrate 101 and to the element isolation dielectric film 102 can be diminished. Further, the etch stopper 111 is formed at a boundary between the heavily-doped diffusion layer 108 and the element isolation dielectric film 102, thereby preventing etching of the edge of the element isolation dielectric film 102.

Figure 16:
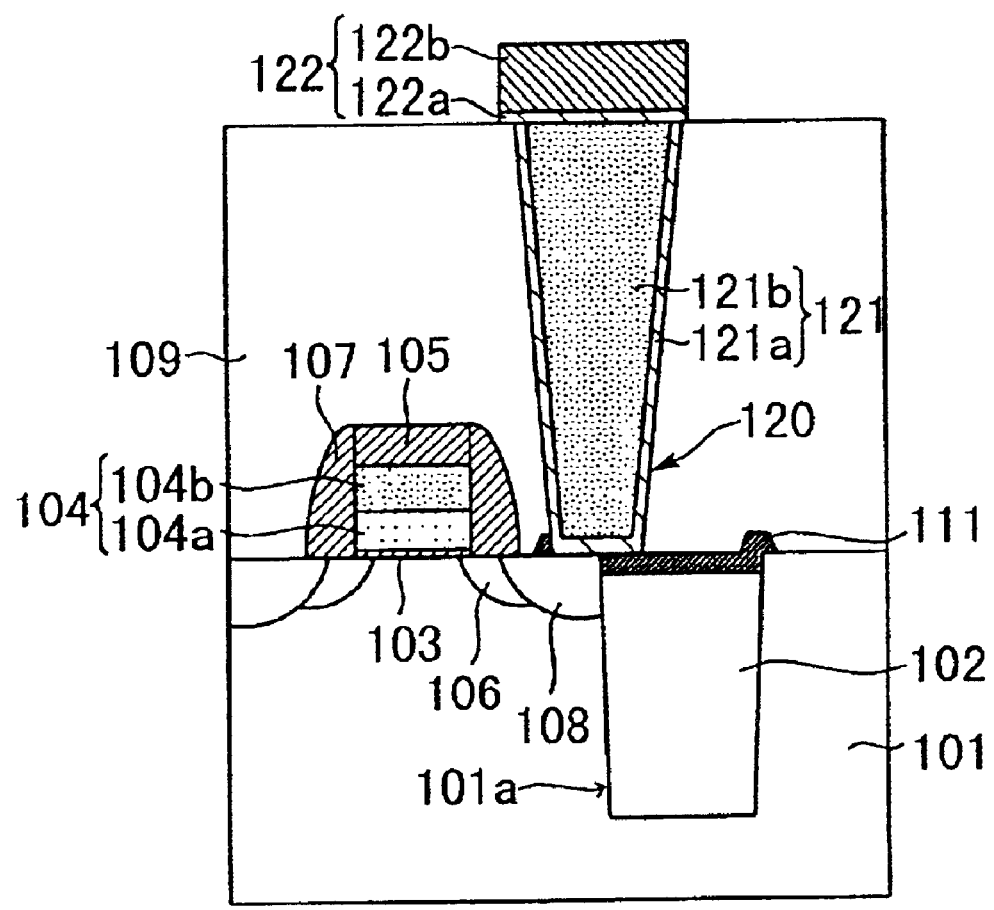

Finally, as shown in FIG. 16, the barrier metal layer 121a consisting of, e.g., TiN/Ti, is formed in the contact hole 120 to a thickness of 20 nm/20 nm. Further, tungsten 121b is formed in the contact hole 120 to a thickness of 200 nm by means of CVD. Unnecessary tungsten is removed from the thus-formed tungsten layer, by means of the CMP technique. As a result, the tungsten plug 121b is formed. More specifically, the contact 121 consisting of the barrier metal layer 121a and the tungsten plug 121b is formed in the contact hole 120. For example, on the contact 121, TiN/Ti is formed as the barrier metal layer 122a to a thickness of 20 nm/20 nm, thereby forming the tungsten film 122b to a thickness of 100 nm Thus, the barrier metal layer 122a and the tungsten film 122b are patterned. As a result, a second interconnection layer 122 is formed on the contact 121.

As mentioned above, in the second embodiment, the etch stopper film 111 is formed at a boundary between the active region and the element isolation region; that is, at a boundary between the heavily-doped diffusion layer 108 and the element isolation dielectric film 102. As a result, there can be reduced etching damage imparted to the substrate 101 when the contact hole 120 is formed (particularly, over-etching operation). Hence, there can be formed a superior contact junction involving a small leakage current.

When the contact hole 120 is formed, the portion of the element isolation dielectric film 102 located at the boundary; that is, the edge of the element isolation dielectric film 102, is not etched in the form of a slit. Thus, the bottom of the contact hole 120 assumes an improved geometry. Hence, the barrier metal layer 121a and the tungsten layer 121b can be formed in the contact hole 120 with superior coverage. Hence, the contact 121 can be formed so as to have a high degree of reliability.

In the second embodiment, the etch stopper film 111 is formed simultaneously in the mark section and in the circuit section. The etch stopper film 111 formed in the mark section is used as an overlay mark. Since the etch stopper film 111 has superior contrast, the position of the etch stopper film 111; that is, the position of an overlay mark, can be measured readily and with high accuracy. Accordingly, there can be performed highly-accurate overlay inspection.

In the second embodiment, the surface of the element isolation dielectric film 102 is made lower than the surface of the active region. As a result, the thickness of a boundary between the element isolation dielectric film 102 and the active region; namely, the thickness of the etch stopper film 111 formed along the edge of the element isolation dielectric film 102, is increased effectively. Accordingly, the etching damage imparted to the substrate 101 at the time of formation of the contact holes 120 can be reduced to a much greater extent than in the case of the first embodiment. Moreover, the surface of the element isolation dielectric film 102 is made lower than the active region, thereby enabling an improvement in the current drive capability of a transistor. Thus, the present embodiment is effective for speeding up the operation of a logic section of, e.g., eDRAM (embedded DRAM) (the same also applies to a third embodiment to be described later).

Third Embodiment

In the second embodiment, the surface of the element isolation dielectric film located in the circuit section and the mark section are made lower than the surface of the substrate located in the active region. An etch stopper film is patterned so as to cover the edge of each of the surfaces of the element isolation dielectric films.

In a third embodiment of the present invention, the surface of the element isolation dielectric film located in the circuit section and the mark section are made lower than the surface of the substrate located in the active region. Further, the etch stopper film is formed in a self-aligned manner in only an edge of the surface of the element isolation dielectric surface. In the third embodiment, a silicide layer is formed on the surface of the heavily-doped diffusion layer.

Figure 17:
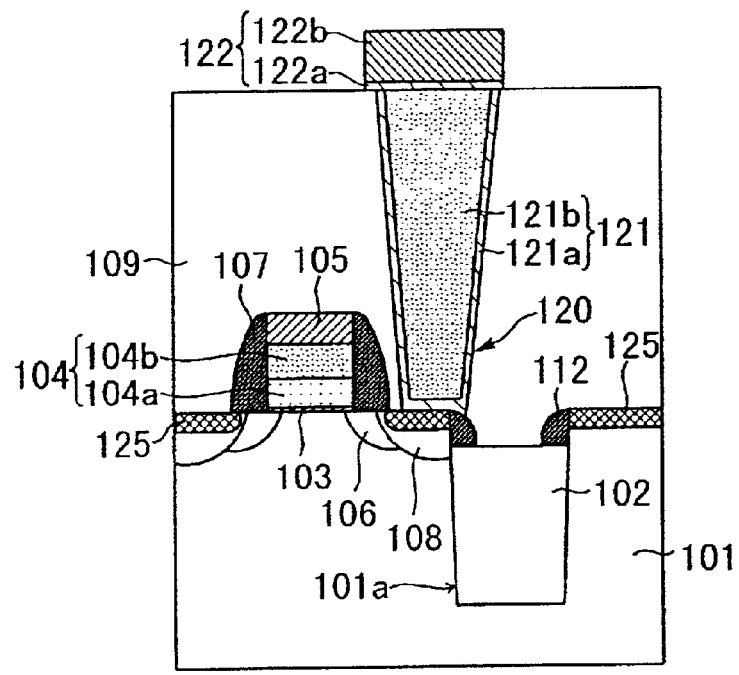
FIG. 17 is a cross-sectional view for describing a circuit section of a semiconductor device according to a third embodiment of the present invention.
Figure 18A:
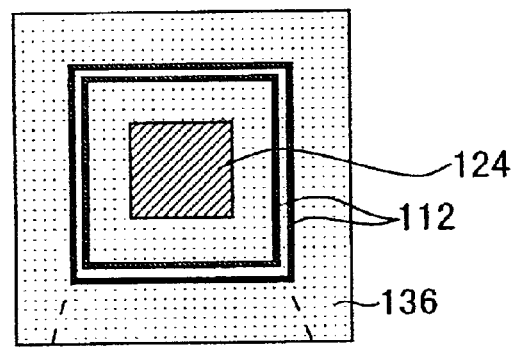
FIGS. 18A and 18B are views for describing a mark section of a semiconductor device according to a third embodiment of the present invention.
Figure 18B:
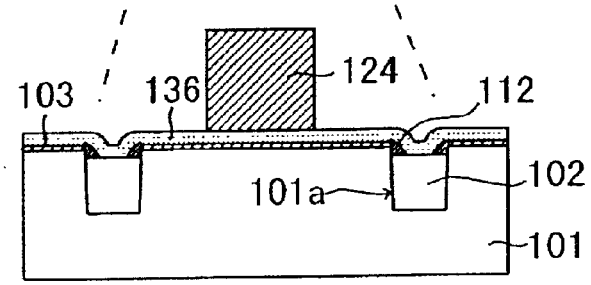

FIG. 17 is a cross-sectional view for describing a circuit section of a semiconductor device according to the third embodiment. FIGS. 18A and 18B are views for describing a mark section of the semiconductor device according to the third embodiment.

In FIGS. 17, 18A, and 18B, those reference numerals which are the same as those shown in FIG. 9 or FIGS. 10A and 10B designate the same elements, and hence their explanations are simplified or omitted.

As shown in FIG. 17, the element isolation dielectric film 102 is embedded in the element isolation trench to a thickness of 250 nm, whereby the surface of the element isolation dielectric film 102 becomes lower than the surface of the substrate 101. A silicon nitride film serving as an etch stopper film 112 is formed on an edge of the element isolation dielectric film 102 in a self-aligned manner. An area located on the element isolation dielectric film 102; namely, the both sides of the element isolation trench 101a where no element isolation dielectric film 102 is embedded, is covered with the etch stopper film 112. Further, a silicide layer is formed on the heavily-doped diffusion layer 108.

As shown in FIGS. 18A and 18B, the etch stopper film 112 is formed so as to cover an edge of the element isolation dielectric film 102 in the mark section, as in the case of the circuit section. The etch stopper film 112 formed in the mark section is used as an overlay mark for inspecting the overlay between the resist pattern 123 of the circuit section and the base layer (which will be described later).

Thus, there is yielded the same advantage as that yielded in the second embodiment.

A method of manufacturing a semiconductor device according to the third embodiment will now be described. FIGS. 19 through 24 are views for describing a method of manufacturing a semiconductor device according to the third embodiment.

Figure 19:
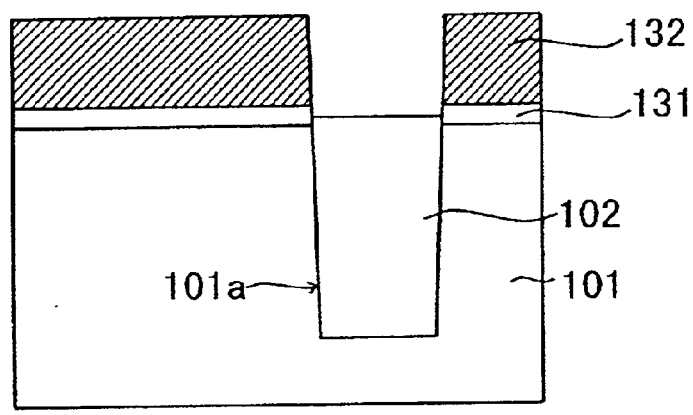
FIGS. 19 through 24 are views for describing a method of manufacturing a semiconductor device according to a third embodiment of the present invention.

First, a process shown in FIG. 19 is performed. Since the process shown in FIG. 19 is identical with that shown in FIG. 11 relating to the second embodiment, its explanation is omitted.

Figure 20:
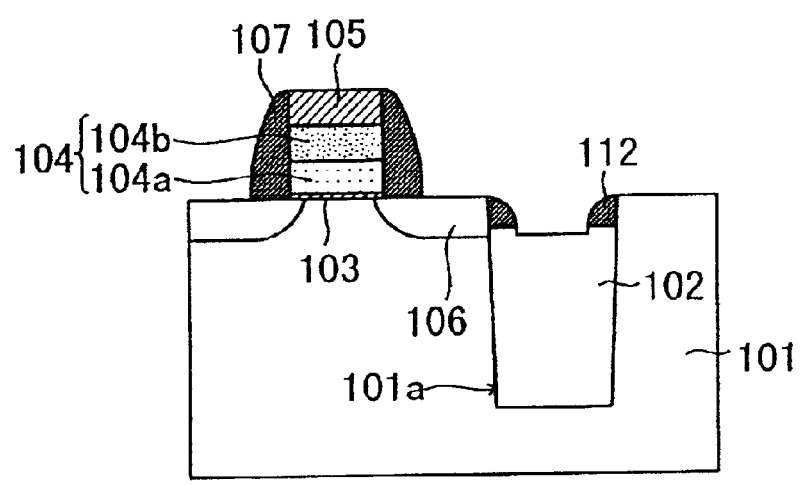
Figure 21:
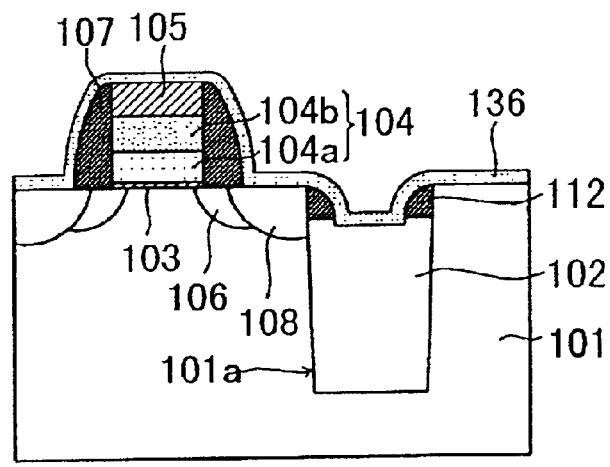

As shown in FIG. 20, the silicon nitride film 132 and the silicon oxide film 131 are subjected to wet etching. As a result, the element isolation dielectric film 102 is formed such that the surface of the element isolation dielectric film 102 becomes lower than the surface of the substrate 101.

For example, a silicon oxynitride film (SiON) is formed as the gate dielectric film 103 to a thickness of 3 nm. The non-doped polysilicon film 104a is formed on the gate dielectric film 103 to a thickness of 100 nm.

N-type and p-type dopants are introduced into the polysilicon film 104a in the same manner as in the case of the first embodiment.

The tungsten film 104b is formed on the polysilicon film 104a to a thickness of 100 nm. Further, the dielectric film (silicon nitride film) 105 is formed on the tungsten film 104b to a thickness of 100 nm.

The dielectric film 105 is patterned, and the tungsten film 104b and the polysilicon film 104a are subjected to dry etching while the thus-patterned dielectric film 105 is taken as a mask. Subsequently, the lightly-doped diffusion layer (n⁻-lightly-doped layer) 106 is formed by means of introducing, e.g., arsenic (As⁺) to the substrate 101 at an angle of 45° and at 30 keV and 1E14 cm⁻².

For instance, the silicon nitride film is formed over the entire surface of the substrate to a thickness of 50 nm, and the thus-formed silicon nitride film is etched back. As a result, the sidewall 107 is formed on either side of the gate electrode 104. Simultaneously, the etch stopper film 112 for covering an edge of the element isolation dielectric film 102 is formed in a self-aligned manner.

For example, arsenic is introduced into the substrate 101 at 50 keV and 5E15 cm⁻² while the sidewall 107 is taken as a mask, thereby forming the heavily-doped diffusion layer (heavily-doped n⁺ layer) 108 which is higher in doping level than the lightly-doped diffusion layer 106.

A silicide protection film 136 made of a silicon oxide film is formed over the entire surface of the substrate.

A resist pattern (124) which is to be used as a mask for patterning the silicide protection film 136 is formed on the silicide protection film 136. Here, the resist pattern (124) is an opening where silicide is to be formed.

Figure 22A:
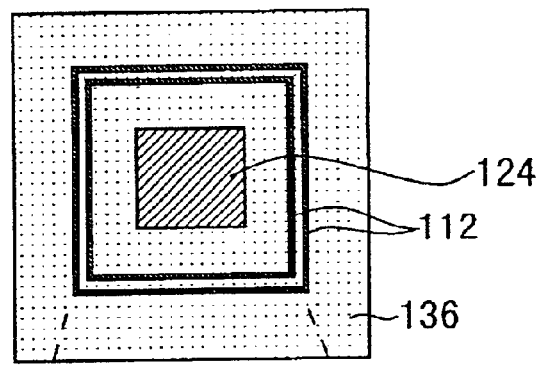
Figure 22B:
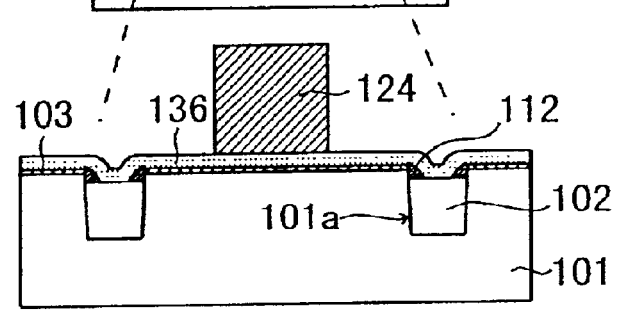

As shown in FIG. 22, the resist pattern 124 is formed also in the mark section.

After formation of the resist pattern 124, an overlay between the resist pattern 124 and the base layer is inspected while the etch stopper film 112 located in the mark section is taken as an overlay mark. Through overlay inspection, the position of the inspection mark (i.e., the etch stopper film 112) can be measured accurately. Accordingly, an overlay of the resist pattern 124 can be inspected with high accuracy.

The resist pattern 124 located in the mark section is patterned to a dimension close to the minimum rule of the resist pattern (124) formed in the circuit section; for example, to a dimension ranging from the minimum dimension to about double the same. As a result, the influence of aberration of lenses; that is, the influence of aberration stemming from a difference between steppers, can be suppressed, thereby improving the accuracy of an overlay inspection.

Figure 23:
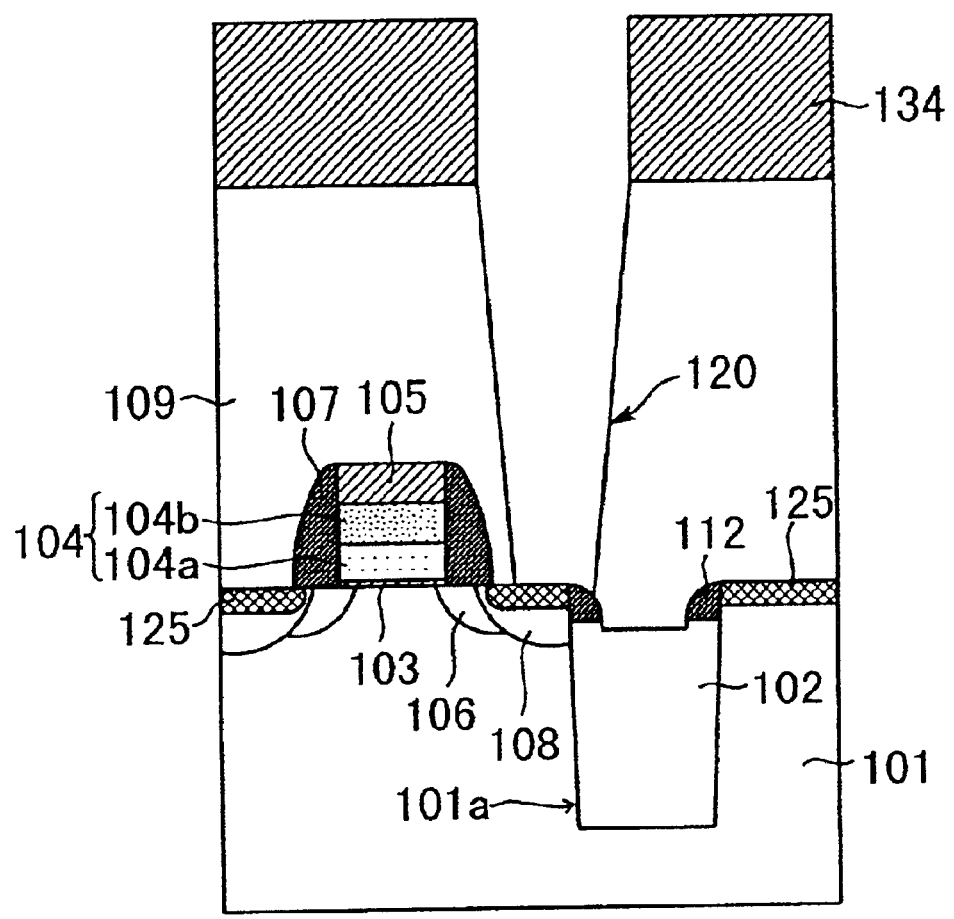

As shown in FIG. 23, a metal film is formed from, e.g., cobalt, on the entire surface of the substrate, and the thus-formed metal film is then subjected to heat treatment (i.e., silicidation). As a result, a silicide layer 125 is formed on portions of the substrate which are not covered with the silicide protection film 136; namely, the upper portion of the heavily-doped diffusion layer 108. Subsequently, the silicide protection film 136 is removed by means of wet etching.

For example, an HDP oxide film is formed to a thickness of 1000 nm as the interlayer dielectric film 109, and the thus-formed interlayer dielectric film 109 is subjected to CMP processing by an amount of 300 nm. The resist pattern 134 is formed on the interlayer dielectric film 109. Subsequently, the interlayer dielectric film 109 is subjected to dry etching on etching condition that there is achieved a high etch selectivity to the active region 108 and the etch stopper film 112, while the resist pattern 134 is taken as a mask. As a result, there is formed, in the interlayer dielectric film 109, a contact hole 120 which has a diameter of 0.2 $\mu$m at the surface of the interlayer dielectric film 109 and which extends from the surface of the interlayer dielectric film 109 to the surface of the substrate 101.

Figure 24:
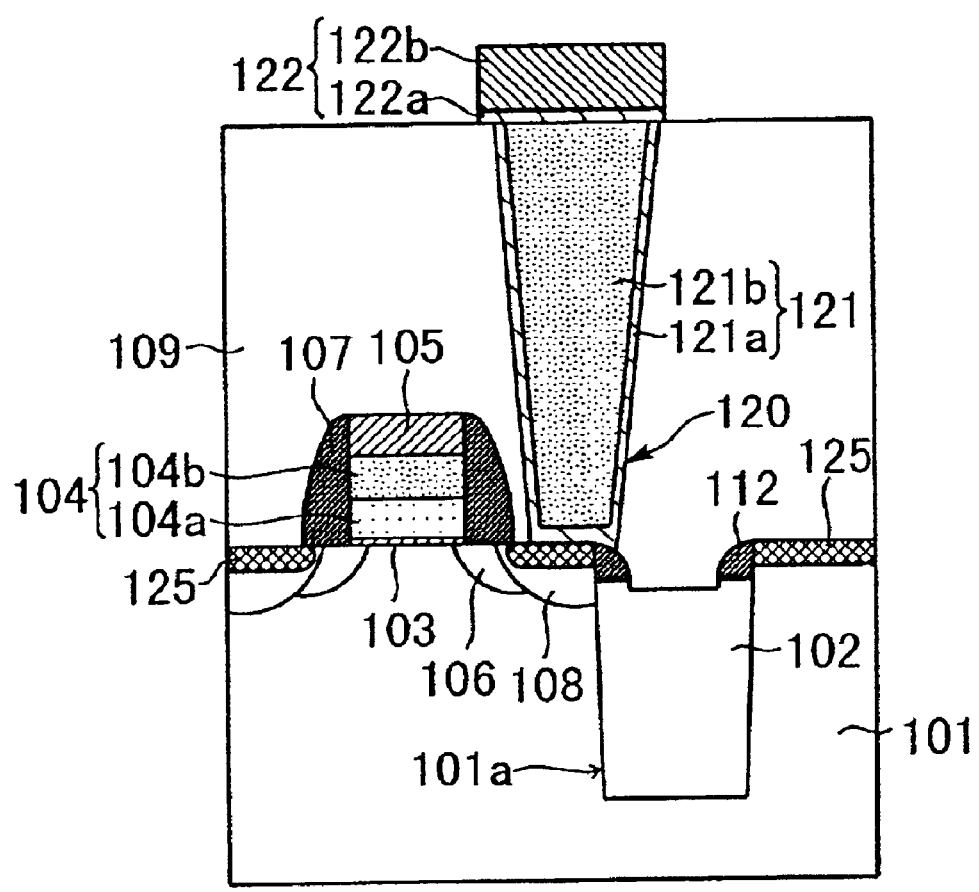

Finally, as shown in FIG. 24, the barrier metal layer 121a consisting of, e.g., TiN/Ti, is formed in the contact hole 120 to a thickness of 20 nm/20 nm. Further, the tungsten 121b is formed in the contact hole 120 to a thickness of 200 nm by means of CVD. Unnecessary tungsten is removed from the thus-formed tungsten layer, by means of the CMP technique. As a result, the tungsten plug 121b is formed. More specifically, the contact 121 consisting of the barrier metal layer 121a and the tungsten plug 121b is formed in the contact hole 120. For example, on the contact 121, TiN/Ti is formed as the barrier metal layer 122a to a thickness of 20 nm/20 nm, thereby forming the tungsten film 122b to a thickness of 100 nm. Thus, the barrier metal layer 122a and the tungsten film 122b are patterned. As a result, the second interconnection layer 122 is formed on the contact 121.

As mentioned above, in the third embodiment, the etch stopper film 112 is formed, in a self-aligned manner, at a boundary between the active region and the element isolation region; that is, at a boundary between the heavily-doped diffusion layer 108 and the element isolation dielectric film 102. As a result, there can be reduced etching damage imparted to the substrate 101 when the contact hole 120 is formed. There can be formed a superior contact junction involving a small leakage current.

When the contact hole 120 is formed, the portion of the element isolation dielectric film 102 located at the boundary; that is, at the edge of the element isolation dielectric film 102, is not etched in the form of a slit. Thus, the bottom of the contact hole 120 assumes an improved geometry. Hence, the barrier metal layer 121a and the tungsten layer 121b can be formed in the contact hole 120 with superior coverage. Hence, the contact 121 can be formed so as to have a high degree of reliability.

In the third embodiment, the etch stopper film 112 is formed simultaneously in the mark section and in the circuit section. The etch stopper film 112 formed in the mark section is used as an overlay mark. Since the etch stopper film 112 has superior contrast, the position of the etch stopper film 112; that is, the position of an overlay mark, can be measured readily and with high accuracy. Accordingly, highly-accurate overlay inspection can be performed.

In the third embodiment, the etch stopper film 112 is formed in a self-aligned manner, and hence, as compared with the second embodiment, the third embodiment can reduce the number of processes employed. This lowers costs for manufacturing semiconduct or devices.

A modification of the semiconductor device according to the third embodiment will now be described.

Figure 25:
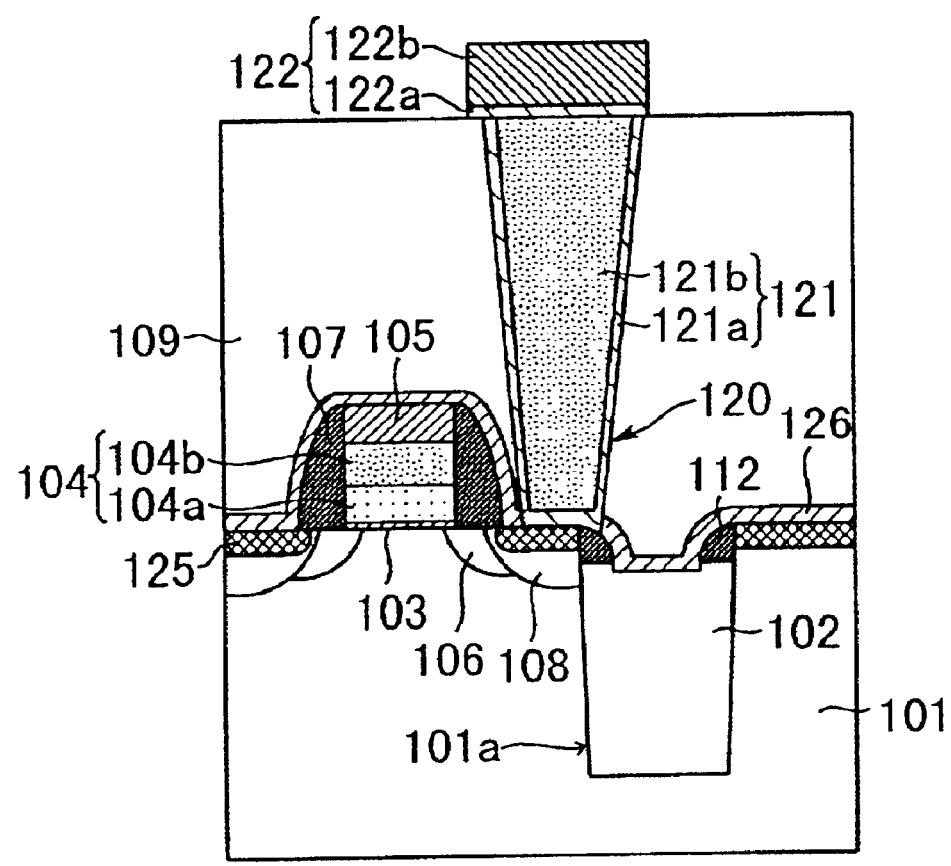
FIG. 25 is a cross-sectional view for describing a modification of a semiconductor device according to a third embodiment of the present invention.

FIG. 25 is a cross-sectional view for describing a modification of the semiconductor device according to the third embodiment.

The semiconductor device of the modification differs from that described in connection with the third embodiment in that the silicon nitride film 126 is formed over the entire surface of the substrate to a thickness of, e.g., 300 nm, after formation of the silicide layer 125.

As described in connection with the modification, even when the contact hole 120 greatly deviates from the width of a sidewall, the silicon nitride film 126 prevents the contact hole 120 from assuming a slit shape, thus enabling formation of the contact hole 120 of superior geometry.

Fourth Embodiment

In the first embodiment, the element isolation dielectric film is formed such that the surface of the active region on the substrate becomes flush with the surface of the element isolation dielectric film. Further, the etch stopper film is formed so as to cover an edge of the surface of the element isolation dielectric film.

In a fourth embodiment of the present invention, the surface of the element isolation dielectric film located in the circuit section and the mark section become higher than the portion of the substrate located in the active region, an etch stopper film is formed along an edge of the surface of the element isolation dielectric film.

Figure 26:
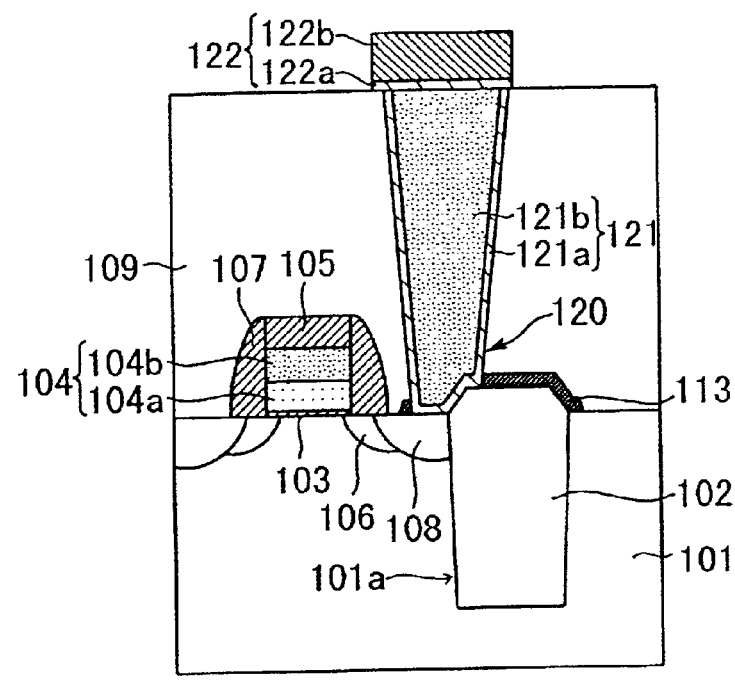
FIG. 26 is a cross-sectional view for describing a circuit section of a semiconductor device according to a fourth embodiment of the present invention.
Figure 27A:
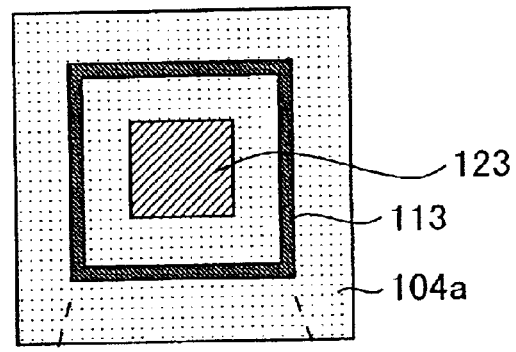
FIGS. 27A and 27B are views for describing a mark section of a semiconductor device according to a fourth embodiment of the present invention.
Figure 27B:
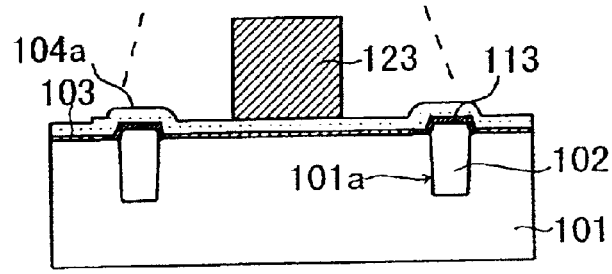

FIG. 26 is a cross-sectional view for describing a circuit section of a semiconductor device according to the fourth embodiment. FIGS. 27A and 27B are views for describing a mark section of the semiconductor device according to the fourth embodiment.

In FIGS. 26, 27A, and 27B, those reference numerals which are the same as those shown in FIG. 1 or FIGS. 2A and 2B designate the same elements, and hence their explanations are simplified or omitted.

As shown in FIG. 26, the element isolation dielectric film 102 is formed so as to become higher than the surface of the substrate 101. A silicon nitride film serving as an etch stopper film 113 is formed so as to cover at least an edge of the element isolation dielectric film 102.

As shown in FIGS. 27A and 27B, the etch stopper film 113 is formed so as to cover an edge of the element isolation dielectric film 102 in the mark section, as in the case of the circuit section. The etch stopper film 113 formed in the mark section is used as an overlay mark for inspecting an overlay between the resist pattern 123 and the base layer (which will be described later).

A method of manufacturing a semiconductor device according to the fourth embodiment will now be described. FIGS. 28 through 33 are views for describing a method of manufacturing a semiconductor device according to the fourth embodiment.

Figure 28:
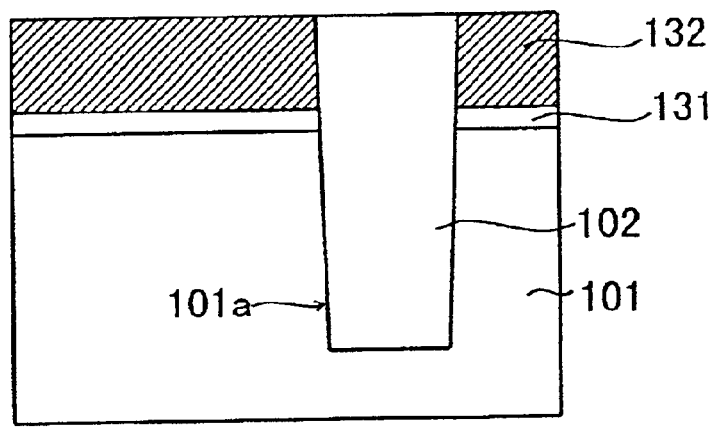
FIGS. 28 through 33 are views for describing a method of manufacturing a semiconductor device according to a fourth embodiment of the present invention.

As shown in FIG. 28, the thermal oxide film 131 is formed on the substrate 101 to a thickness of, e.g., 30 nm. Next, the silicon nitride film 132 is formed on the thermal oxide film 131 to a thickness of, e.g., 150 nm. The resist pattern (not shown) covering an active region is formed on the silicon nitride film 132. While the thus-formed resist pattern is taken as a mask, the silicon nitride film 132 and the thermal oxide film 131 are subjected to dry etching. Further, the substrate 101 is subjected to dry etching while the thus-etched silicon nitride film 132 and the thermal oxide film 131 are taken as masks. As a result, the element isolation trench 101a is formed in the substrate 101 to a depth of, e.g., 30 nm. Next, an HDP oxide film, for example, is deposited as the element isolation dielectric film 102 to a thickness of 500 nm in the element isolation trench 101a. The thus-deposited HDP oxide film is then subjected to CMP processing.

The element isolation dielectric film 102 is subjected to wet etching by only an amount of, e.g., 50 nm.

Figure 29:
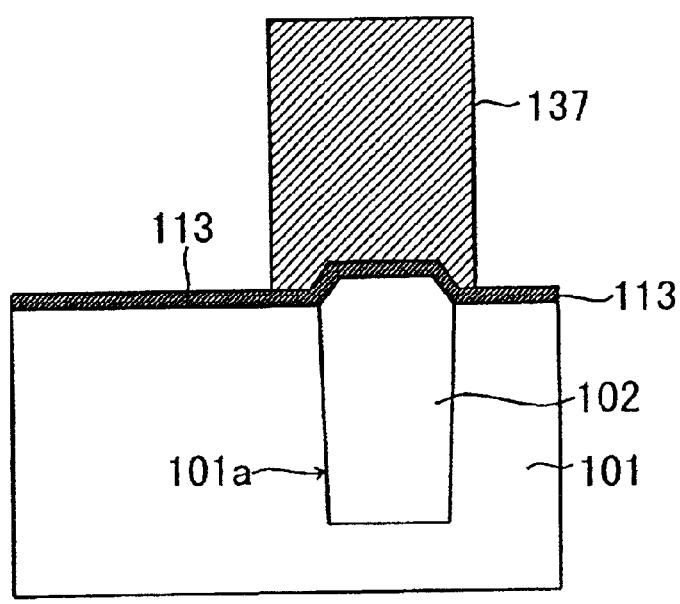

As shown in FIG. 29, the silicon nitride film 132 and the silicon oxide film 131 are subjected to wet etching. As a result, the element isolation dielectric film 102 is formed such that the surface of the element isolation dielectric film 102 becomes higher than that of the substrate 101. Next, a silicon nitride film serving as the etch stopper 113 is formed over the substrate to a thickness of 30 nm. Further, a resist pattern 137 is formed on the etch stopper 113. The resist pattern 137 is formed so as to cover an edge of the element isolation dielectric film 102.

Figure 30:
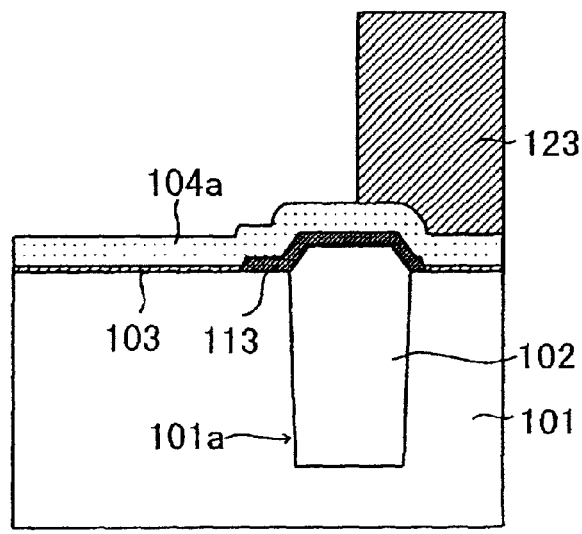

As shown in FIG. 30, the etch stopper 113 is subjected to wet etching while the resist pattern 137 is taken as a mask. Simultaneously, the etch stopper 113 located in the mark section is also patterned [see FIGS. 31A and 31B].

The resist pattern 137 is then removed. For example, a silicon oxynitride film (SiON) is formed as the gate dielectric film 103 to a thickness of 3 nm. Further, the non-doped polysilicon film 104a is formed on the gate dielectric film 103 to a thickness of 100 nm.

The resist pattern 123—which is to serve as a mask for introducing n-type dopants into the polysilicon film 104a— is formed on the non-doped polysilicon film 104a.

Figure 31A:
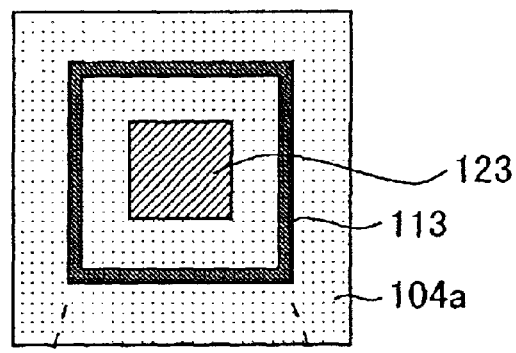
Figure 31B:
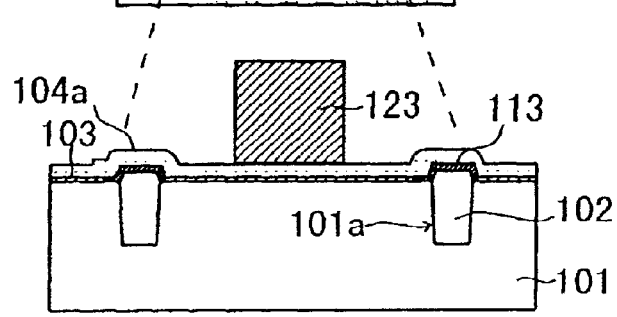

As shown in FIGS. 31A and 31B, the resist pattern 123 is formed simultaneously in the mark section.

After formation of the resist pattern 123, there is inspected an overlay between the resist pattern 123 and the base layer while the etch stopper film 113 located in the mark section is taken as an overlay mark. Through overlay inspection, the position of the etch stopper film 113 serving as an inspection mark can be measured accurately. Accordingly, the overlay inspection of the resist pattern 123 can be performed accurately.

The resist pattern 123 located in the mark section is patterned to a dimension close to the minimum rule of the resist pattern 123 formed in the circuit section. As a result, the influence of aberration of a lens provided in a stepper can be suppressed, thereby improving the accuracy of an overlay inspection.

N-type and p-type dopants are introduced into the polysilicon film 104a in the same manner as in the case of the first embodiment.

Figure 32:
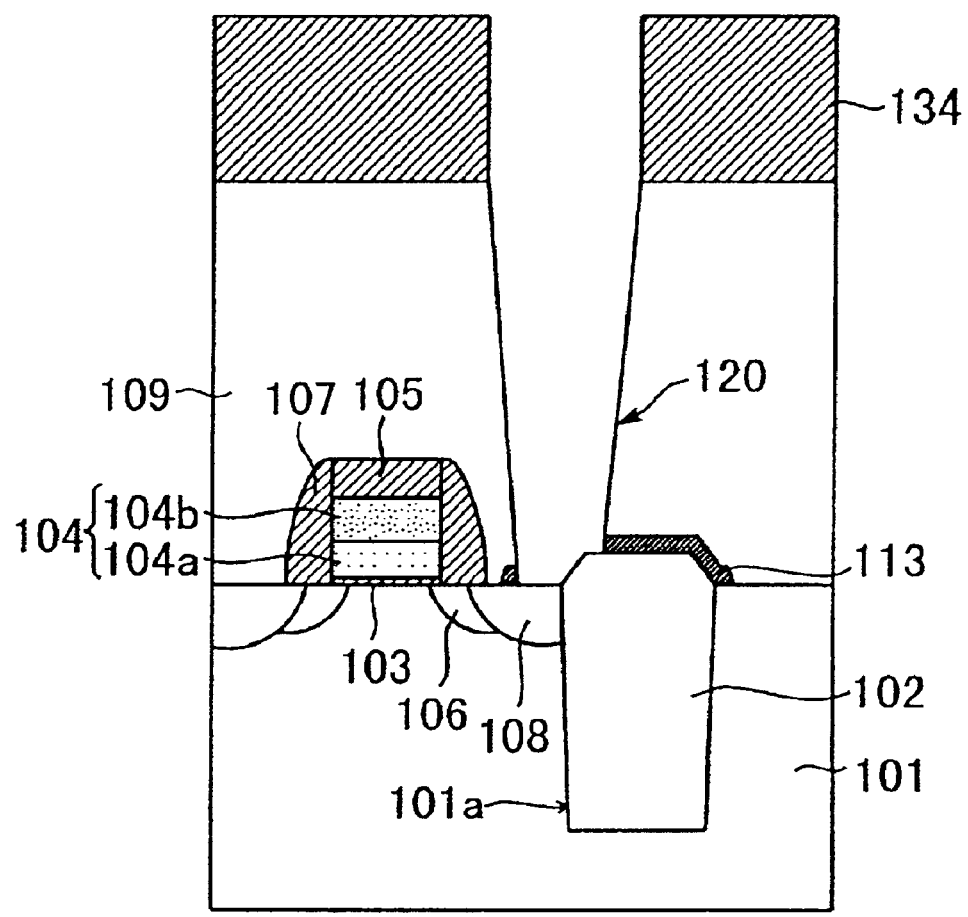

As shown in FIG. 32, the tungsten film 104b is formed on the polysilicon film 104a to a thickness of 100 nm. Further, the dielectric film 105 is formed on the tungsten film 104b to a thickness of 100 nm. The dielectric film 105 is then patterned, and the tungsten film 104b and the polysilicon film 104a are subjected to dry etching while the thus-patterned dielectric film 105 is taken as a mask. Thus, the gate electrode 104 is formed.

Subsequently, the lightly-doped diffusion layer (lightly-doped $n^-$ layer) 106 is formed by means of introducing, e.g., arsenic ($As^+$) to the substrate 101 at an angle of 45° and at 30 keV and $1E14\ cm^{-2}$. For instance, a silicon nitride film is formed over the entire surface of the substrate to a thickness of 50 nm, and the thus-formed silicon nitride film is etched back. As a result, the sidewall 107 is formed on either side of the gate electrode 104. For example, arsenic is introduced into the substrate 101 at 50 keV and $5E15\ cm^{-2}$ while the sidewall 107 is taken as a mask, thereby forming the heavily-doped diffusion layer (heavily-doped $n^{30}$ layer) 108 which is higher in doping level than the lightly-doped diffusion layer 106.

For example, an HDP oxide film is formed to a thickness of 1000 nm as the interlayer dielectric film 109, and the thus-formed interlayer dielectric film 109 is subjected to CMP processing by an amount of 300 nm. The resist pattern 134 is formed on the interlayer dielectric film 109.

Subsequently, the interlayer dielectric film 109 is subjected to dry etching on etching (main etching) condition that there is achieved a high etch selectivity to the etch stopper film 113, while the resist pattern 134 is taken as a mask. As a result, there is formed, in the interlayer dielectric film 109, the contact hole 120 which has a diameter of 0.2 μm at the surface of the interlayer dielectric film 109 and which extends from the surface of the interlayer dielectric film 109 to the surface of the etch stopper film 113. Since the interlayer dielectric film 109 is subjected to dry etching on condition that there is achieved a high etch selectivity to the etch stopper film 113; that is, on condition that there is achieved a high etch selectivity to a silicon nitride film, etching damage is not imparted to the active region of the substrate 101 even when a plurality of contact holes of different depths are formed simultaneously.

The etch stopper 113 provided on a substrate 101 is etched on etching (over-etching) condition that there is achieved a high etch selectivity to the element isolation dielectric film 102 and the substrate 101, thereby forming the contact hole 120 extending from the surface of the interlayer dielectric film 109 to the surface of the substrate 101. Here, the etch stopper 113 having a comparatively small and uniform thickness can be removed within a short period of time. More specifically, the contact hole 120 is formed in two steps, and hence etching damage imparted to both the substrate 101 and to the element isolation dielectric film 102 can be diminished. Further, the etch stopper 113 is formed at a boundary between the heavily-doped diffusion layer 108 and the element isolation dielectric film 102, thereby preventing etching of the edge of the element isolation dielectric film 102.

Figure 33:
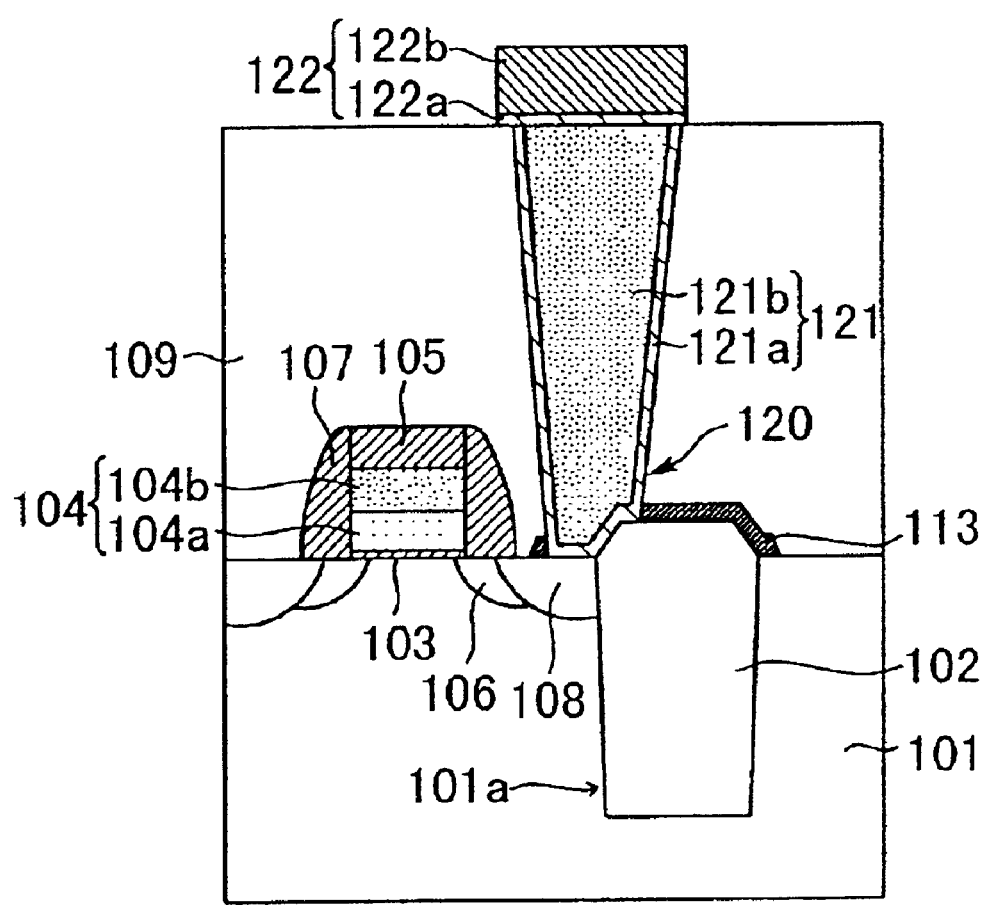

Finally, as shown in FIG. 33, the barrier metal layer 121a consisting of, e.g., TiN/Ti, is formed in the contact hole 120 to a thickness of 20 nm/20 nm. Further, tungsten 121b is formed in the contact hole 120 to a thickness of 200 nm by means of CVD. Unnecessary tungsten is removed from the thus-formed tungsten layer, by means of the CMP technique. As a result, the tungsten plug 121b is formed. More specifically, the contact 121 consisting of the barrier metal layer 121a and the tungsten plug 121b is formed in the contact hole 120. For example, on the contact 121, TiN/Ti is formed as the barrier metal layer 122a to a thickness of 20 nm/20 nm, thereby forming the tungsten film 122b to a thickness of 100 nm. Thus, the barrier metal layer 122a and the tungsten film 122b are patterned. As a result, a second interconnection layer 122 is formed on the contact 121.

As mentioned above, in the fourth embodiment, the etch stopper film 113 is formed at a boundary between the active region and the element isolation region; that is, at a boundary between the heavily-doped diffusion layer 108 and the element isolation dielectric film 102. As a result, there can be reduced etching damage imparted to the substrate 101 when the contact hole 120 is formed (particularly, over-etching operation). Hence, there can be formed a superior contact junction involving a small leakage current.

When the contact hole 120 is formed, the portion of the element isolation dielectric film 102 located at the boundary; that is, at the edge of the element isolation dielectric film 102, is not etched in the form of a slit. Thus, the bottom of the contact hole 120 assumes an improved geometry. Hence, the barrier metal layer 121a and the tungsten layer 121b can be formed in the contact hole 120 with superior coverage. Hence, the contact 121 can be formed so as to have a high degree of reliability.

In the fourth embodiment, the etch stopper film 113 is formed simultaneously in the mark section and in the circuit section. The etch stopper film 113 formed in the mark section is used as an overlay mark. Since the etch stopper film 113 has superior contrast, the position of the etch stopper film 113; that is, the position of an overlay mark, can be measured readily and with high accuracy. Accordingly, there can be accurately performed an overlay inspection of an overlay between the resist pattern (e.g., the resist pattern 123 shown in FIG. 30) and a base layer (lower pattern).

In the fourth embodiment, the element isolation dielectric film 102 is formed such that the surface of the element isolation dielectric film 102 becomes higher than the surface of the active region. Such a construction prevents occurrence of a reversely-narrowed in a DRAM section of eDRAM, thereby suppressing a leakage current (the same also applies to a fifth embodiment to be described later).

In the fourth embodiment, the surface of the element isolation dielectric film 102 is made higher than that of the substrate 101, by means of adjusting the amount of element isolation dielectric film 102 to be wet-etched. However, the element isolation dielectric film 102 is not necessarily subjected to wet etching.

The surface of the element isolation dielectric film 102 can be made higher than that of the substrate, by means of arranging a CMP dummy pattern densely in the vicinity of the element isolation dielectric film 102.

Fifth Embodiment

In the fourth embodiment of the present invention, the surface of the element isolation dielectric film located in the circuit section and the mark section become higher than the surface of the substrate located in the active region, an etch stopper film is formed by means of patterning so as to cover an edge of the surface of the element isolation dielectric film.

In a fifth embodiment of the present invention, the surface of the element isolation dielectric film located in the circuit section and the mark section are made so as to become higher than the surface of the substrate located in the active region. The etch stopper film is formed in only an edge of the surface of the element isolation dielectric film in a self-aligned manner. Further, in the fifth embodiment, a suicide layer is formed in an upper portion of a heavily-doped diffusion layer.

FIG. 34 is a cross-sectional view for describing a circuit section of a semiconductor device according to the fifth embodiment. FIGS. 35A and 35B are views for describing a mark section of the semiconductor device according to the fifth embodiment.

In FIGS. 34, 35A, and 35B, those reference numerals which are the same as those shown in FIG. 26 or FIGS. 27A and 27B designate the same elements, and hence their explanations are simplified or omitted.

As shown in FIG. 34, the element isolation dielectric film 102 is formed such that the surface of the element isolation dielectric film 102 becomes higher than the surface of the substrate 101. Further, a silicon nitride film serving as an etch stopper film 114 is formed in a self-aligned manner so as to cover an edge of the element isolation dielectric film 102.

As shown in FIGS. 35A and 35B, the etch stopper film 114 is formed so as to cover an edge of the element isolation dielectric film 102 in the mark section, as in the case of the circuit section. The etch stopper film 114 formed in the mark section is used as an overlay mark for inspecting the overlay between the resist pattern 124 and the base layer (which will be described later).

A method of manufacturing a semiconductor device according to the fifth embodiment will now be described. FIGS. 36 through 41 are views for describing a method of manufacturing a semiconductor device according to the fifth embodiment.

Figure 36:
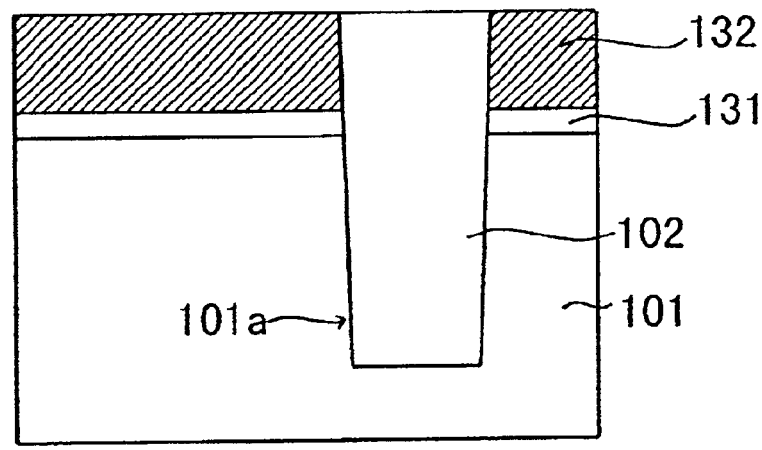

First, a process shown in FIG. 36 is performed. Since the process shown in FIG. 36 is identical with that shown in FIG. 28 relating to the fourth embodiment, its explanation is omitted.

Figure 37:
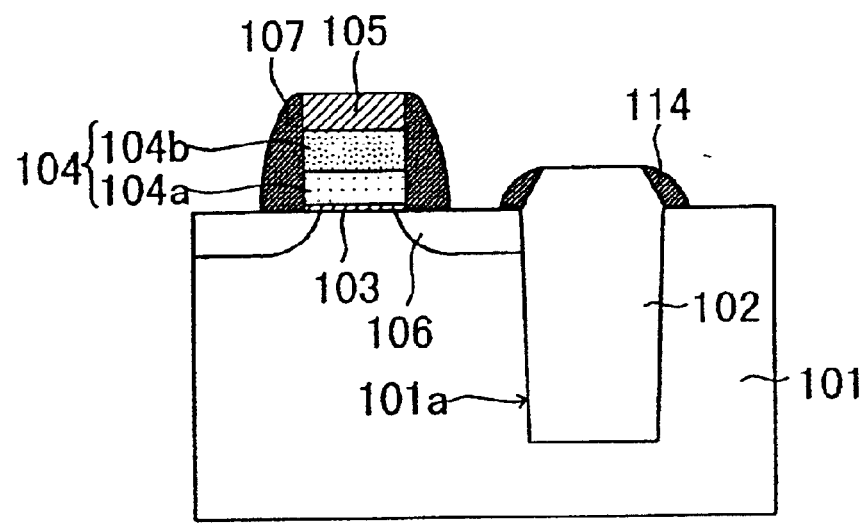

As shown in FIG. 37, the silicon nitride film 132 and the silicon oxide film 131 are subjected to wet etching. As a result, the element isolation dielectric film 102 is formed such that the surface of the element isolation dielectric film 102 becomes higher than the surface of the substrate 101.

For example, a silicon oxynitride film (SiON) is formed as the gate dielectric film 103 to a thickness of 3 nm. The non-doped polysilicon film 104a is formed on the gate dielectric film 103 to a thickness of 100 nm. N-type and p-type dopants are introduced into the polysilicon film 104a in the same manner as in the first embodiment. The tungsten film 104b is formed on the polysilicon film 104a to a thickness of 100 nm. Further, the dielectric film (silicon nitride film) 105 is formed on the tungsten film 104b to a thickness of 100 nm.

The dielectric film 105 is patterned, and the tungsten film 104b and the polysilicon film 104a are subjected to dry etching while the thus-patterned dielectric film 105 is taken as a mask. Subsequently, the lightly-doped diffusion layer (lightly-doped n⁻ layer) 106 is formed by means of introducing, e.g., arsenic (As⁺) to the substrate 101 at an angle of 45° and at 30 keV and 1E14 cm⁻².

For instance, the silicon nitride film is formed over the entire surface of the substrate to a thickness of 50 nm, and the thus-formed silicon nitride film is etched back. As a result, the sidewall 107 is formed on either side of the gate electrode 104. Simultaneously, the etch stopper film 112 for covering an edge of the element isolation dielectric film 102 is formed in a self-aligned manner.

For example, arsenic is introduced into the substrate 101 at 50 keV and 5E15 cm⁻² while the sidewall 107 is taken as a mask, thereby forming the heavily-doped diffusion layer (heavily-doped n⁺ layer) 108 which is higher in doping level than the lightly-doped diffusion layer 106.

The side protection film 136 made of a silicon oxide film is formed over the entire surface of the substrate 101.

The resist pattern (124) which is to be used as a mask for patterning the silicide protection film 136 is formed on the silicide protection film 136. Here, the resist pattern (124) is an opening where silicide is to be formed.

As shown in FIG. 39, the resist pattern 124 is formed also in the mark section.

After formation of the resist pattern 124, an overlay between the resist pattern 124 and the base layer is inspected while the etch stopper film 114 located in the mark section is taken as an overlay mark. Through overlay inspection, the position of the etch stopper film 114 serving as an overlay mark can be measured accurately. Accordingly, an overlay of the resist pattern 124 can be inspected with high accuracy.

The resist pattern 124 located in the mark section is patterned to a dimension close to the minimum rule of the resist pattern (124) formed in the circuit section; for example, a dimension ranging from the minimum dimension to about double the same. As a result, the influence of aberration of lenses; that is, the influence of aberration stemming from a difference between steppers, can be suppressed, thereby improving the accuracy of an overlay inspection.

Figure 40:
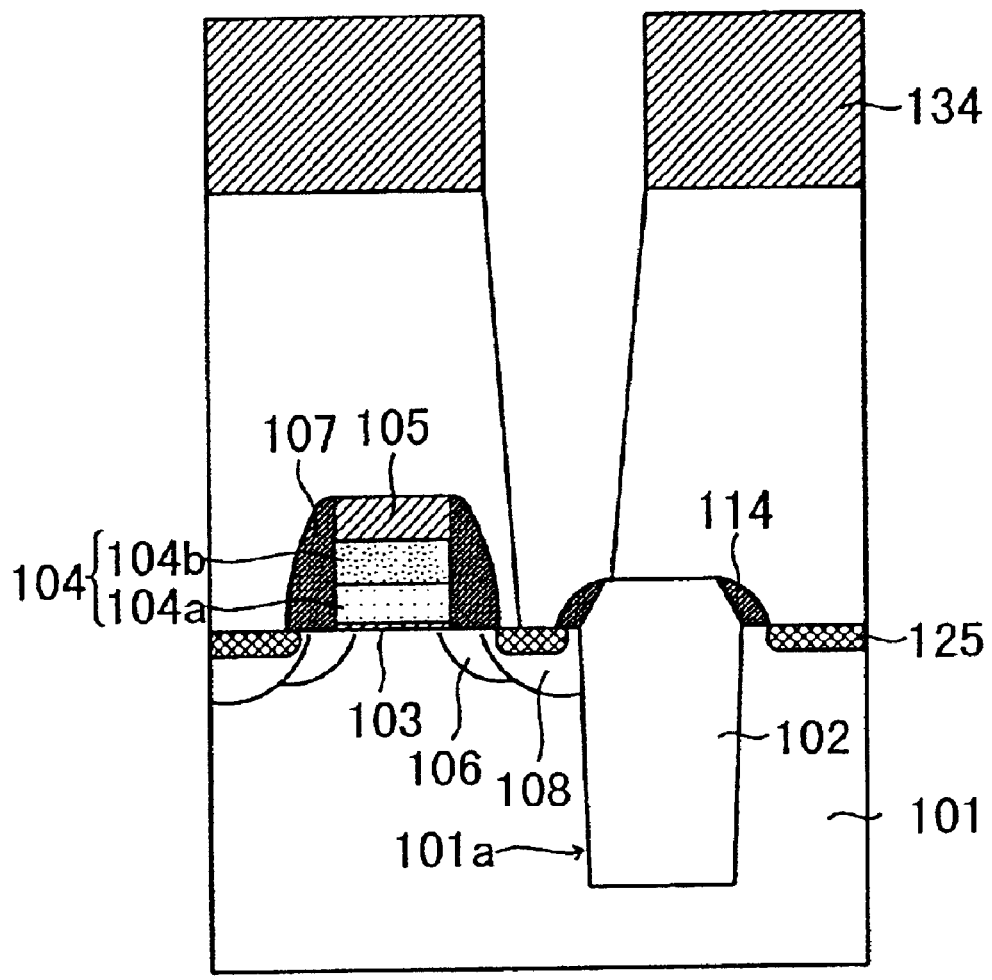

As shown in FIG. 40, a metal film is formed from, e.g., cobalt, on the entire surface of the substrate, and the thus-formed metal film is then subjected to heat treatment (i.e., silicidation). As a result, the silicide layer 125 is formed in upper portions of the substrate which are not covered with the silicide protection film 136; namely, the upper portions of the heavily-doped diffusion layer 108. Subsequently, the silicide protection film 136 is subjected to wet etching.

For example, an HDP oxide film is formed to a thickness of 1000 nm as the interlayer dielectric film 109, and the thus-formed interlayer dielectric film 109 is subjected to CMP processing by an amount of 300 nm. The resist pattern 134 is formed on the interlayer dielectric film 109. Subsequently, the interlayer dielectric film 109 is subjected to dry etching on etching condition that there is achieved a high etch selectivity to the active region 108 and the etch stopper film 114, while the resist pattern 134 is taken as a mask. As a result, there is formed, in the interlayer dielectric film 109, a contact hole 120 which has a diameter of 0.2 μm at the surface of the interlayer dielectric film 109 and which extends from the surface of the interlayer dielectric film 109 to the surface of the substrate 101.

Figure 41:
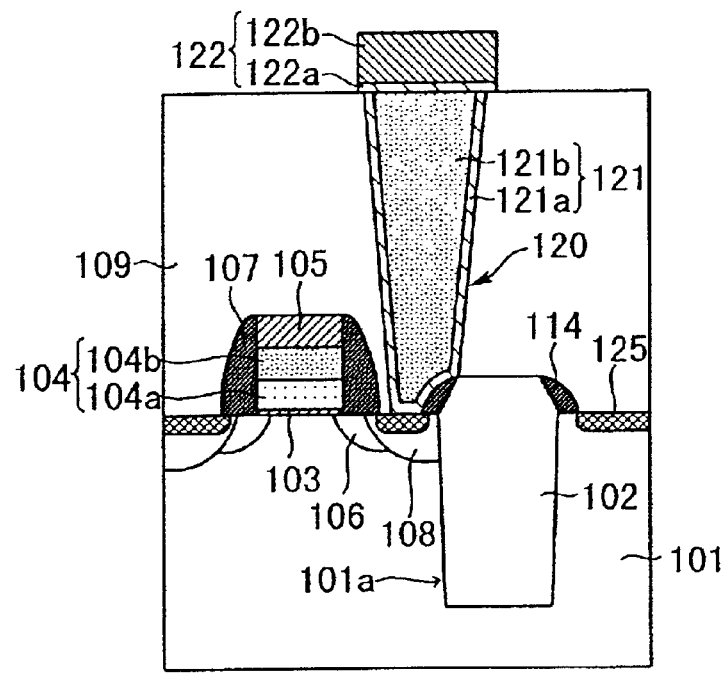

Finally, as shown in FIG. 41, the barrier metal layer 121a consisting of, e.g., TiN/Ti, is formed in the contact hole 120 to a thickness of 20 nm/20 nm. Further, the tungsten 121b is formed in the contact hole 120 to a thickness of 200 nm by means of CVD. Unnecessary tungsten is removed from the thus-formed tungsten layer, by means of the CMP technique. As a result, the tungsten plug 121b is formed. More specifically, the contact 121 consisting of the barrier metal layer 121a and the tungsten plug 121b is formed in the contact hole 120. For example, on the contact 121, TiN/Ti is formed as the barrier metal layer 122a to a thickness of 20 nm/20 nm, thereby forming the tungsten film 122b to a thickness of 100 nm. Thus, the barrier metal layer 122a and the tungsten film 122b are patterned. As a result, the second interconnection layer 122 is formed on the contact 121.

As mentioned above, in the fifth embodiment, the etch stopper film 114 is formed, in a self-aligned manner, at a boundary between the active region and the element isolation region; that is, at a boundary between the heavily-doped diffusion layer 108 and the element isolation dielectric film 102. As a result, there can be reduced etching damage imparted to the substrate 101 when the contact hole 120 is formed. There can be formed a superior contact junction involving a small leakage current.

When the contact hole 120 is formed, the portion of the element isolation dielectric film 102 located at the boundary; that is, at the edge of the element isolation dielectric film 102, is not etched in the form of a slit. Thus, the bottom of the contact hole 120 assumes an improved geometry. Hence, the barrier metal layer 121a and the tungsten layer 121b can be formed in the contact hole 120 with superior coverage. Hence, the contact 121 can be formed so as to have a high degree of reliability.

In the fifth embodiment, the etch stopper film 114 is formed simultaneously in the mark section and in the circuit section. The etch stopper film 114 formed in the mark section is used as an overlay mark. Since the etch stopper film 114 has superior contrast, the position of the etch stopper film 114; that is, the position of an overlay mark, can be measured readily and with high accuracy. Accordingly, there can be performed highly-accurate overlay inspection of an overlay between the resist pattern (124) and the base layer.

In the fifth embodiment, the etch stopper film 114 is formed in a self-aligned manner, and hence, as compared with the fourth embodiment, the fifth embodiment can reduce the number of processes employed. Accordingly, costs for manufacturing semiconductor devices can be curtailed.

A modification of the semiconductor device according to the fifth embodiment will now be described.

Figure 42:
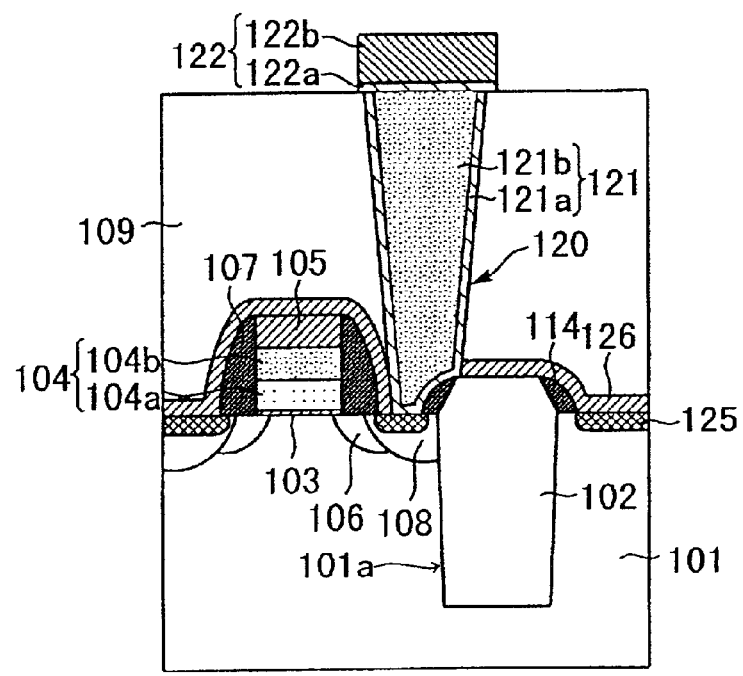
FIG. 42 is a cross-sectional view for describing a modification of a semiconductor device according to a fifth embodiment of the present invention.

FIG. 42 is a cross-sectional view for describing a modification of the semiconductor device according to the fifth embodiment.

The semiconductor device of the modification differs from that described in connection with the fifth embodiment in that the silicon nitride layer 126 is formed over the entire surface of the substrate to a thickness of, e.g., 300 nm, after formation of the silicide layer 125.

As described in connection with the modification, even when the contact hole 120 greatly deviates from the width of a sidewall, the silicon nitride film 126 prevents the contact hole 120 from assuming a slit shape, thus enabling formation of the contact hole 120 of superior geometry.

This invention, when practiced illustratively in the manner described above, provides the following major effects:

According to the present invention, presence of an etch stopper film covering an edge of an element isolation dielectric film protects the element isolation dielectric film from etching at the time of formation of contact holes. As a result, highly reliable contact plugs can be formed.

Further, an etch stopper film is formed on the element isolation dielectric film located in the mark section, and the etch stopper film located in the mark section is employed as an inspection mark. Accordingly, an inspection mark can be formed accurately.

Further, the present invention is not limited to these embodiments, but variations and modifications may be made without departing from the scope of the present invention.

The entire disclosure of Japanese Patent Application No. 2001-190397 filed on Jun. 22, 2001 containing specification, claims, drawings and summary are incorporated herein by reference in its entirety.

What is claimed is:

1. A semiconductor device having a substrate on which are provided a mark section and a circuit section, the circuit section including an element isolation region for isolating an active region, the device comprising:

an element isolation trench formed in the mark section;

an element isolation dielectric film formed in said element isolation trench;

an etch stopper film covering at least a portion of the surface of said element isolation dielectric film;

an interlayer dielectric film formed over art entire surface of the substrate;

a contact hole extending from the surface of said interlayer dielectric film to the surface of the etch stopper film or to the surface of the substrate through the etch stopper film; and circuit elements formed in the circuit section by using said etch stopper film formed in the mark section as an inspection mark.

2. The semiconductor device according to claim 1, wherein said element isolation trench, said element isolation dielectric film, and said etch stopper film are formed further in the element isolation region of the circuit section, and said contact hole is formed further in the active region of the circuit section.

3. The semiconductor device according to claim 2, wherein said etch stopper film formed in the element isolation region covers an edge of the element isolation dielectric film.

4. The semiconductor device according to claim 1, wherein said etch stopper film includes a silicon nitride film.

5. The semiconductor device according to claim 1, wherein said element isolation dielectric film is formed in said element isolation trench such that the surface of said element isolation dielectric film becomes lower than the surface of the substrate.

6. The semiconductor device according to claim 1, wherein said element isolation dielectric film is formed in said element isolation trench such that the surface of said element isolation dielectric film becomes higher than the surface of the substrate.

* * * * *